US009534135B2

(12) United States Patent
Komatsu et al.

(10) Patent No.: US 9,534,135 B2
(45) Date of Patent: Jan. 3, 2017

(54) COMPOSITION FOR PATTERN FORMATION, AND PATTERN-FORMING METHOD

(71) Applicant: JSR CORPORATION, Tokyo (JP)

(72) Inventors: Hiroyuki Komatsu, Tokyo (JP); Takehiko Naruoka, Tokyo (JP); Shinya Minegishi, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/620,935

(22) Filed: Feb. 12, 2015

(65) Prior Publication Data

US 2015/0225601 A1 Aug. 13, 2015

(30) Foreign Application Priority Data

Feb. 13, 2014 (JP) ................................. 2014-025978
Apr. 17, 2014 (JP) ................................. 2014-085946

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| C09D 153/00 | (2006.01) |
| C08F 212/08 | (2006.01) |
| C08F 230/08 | (2006.01) |
| C08F 297/02 | (2006.01) |

(Continued)

(52) U.S. Cl.
CPC ........... *C09D 153/00* (2013.01); *C08F 212/08* (2013.01); *C08F 230/08* (2013.01); *C08F 297/026* (2013.01); *G03F 7/0002* (2013.01); *B05D 1/185* (2013.01)

(58) Field of Classification Search
None
See application file for complete search history.

(56) References Cited

U.S. PATENT DOCUMENTS

2012/0046415 A1* 2/2012 Millward .............. C08F 287/00
525/105
2013/0288482 A1* 10/2013 Nam ................... H01L 21/0273
438/703
2013/0344249 A1* 12/2013 Minegishi .............. C08L 33/14
427/271

FOREIGN PATENT DOCUMENTS

| JP | 2002-519728 A | 7/2002 |
|---|---|---|
| JP | 2003-218383 A | 7/2003 |
| JP | 2008-149447 A | 7/2008 |

(Continued)

OTHER PUBLICATIONS

U.S. Appl. No. 14/691,043, filed Apr. 20, 2015, Komatsu, et al.

(Continued)

*Primary Examiner* — Stephanie Duclair
(74) *Attorney, Agent, or Firm* — Oblon, McClelland, Maier & Neustadt, L.L.P.

(57) ABSTRACT

A composition for pattern formation includes a block copolymer and a solvent. The block copolymer is capable of forming a phase separation structure through directed self-assembly. The block copolymer includes a first block and a second block. The first block includes a first repeating unit which includes at least two silicon atoms. The second block includes a second repeating unit which does not include a silicon atom. A sum of the atomic weight of atoms constituting the first repeating unit is no greater than 700.

20 Claims, 6 Drawing Sheets

(51) Int. Cl.
    *G03F 7/00*          (2006.01)
    *B05D 1/18*          (2006.01)

(56) References Cited

FOREIGN PATENT DOCUMENTS

| | | |
|---|---|---|
| JP | 2013-528664 A | 7/2013 |
| JP | 2013-166932 A | 8/2013 |
| WO | WO 00/00854 | 1/2000 |
| WO | WO 2011/116223 A1 | 9/2011 |

OTHER PUBLICATIONS

U.S. Appl. No. 14/668,335, filed Mar. 25, 2015, Komatsu, et al.
Yuki Kosaka et al., "Living Anionic Polymerization of Benzofulvene: Highly Reactive Fixed Transoid 1,3-Diene", ACS Macro Letters 2013. 2, pp. 164-167.

* cited by examiner

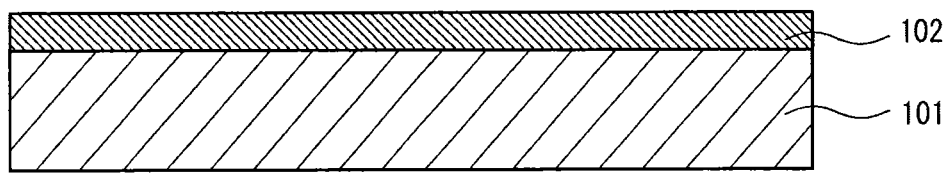
F I G. 1
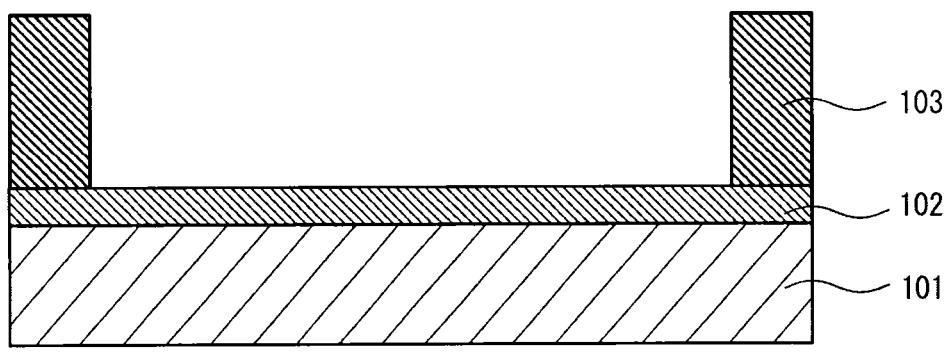
F I G. 2

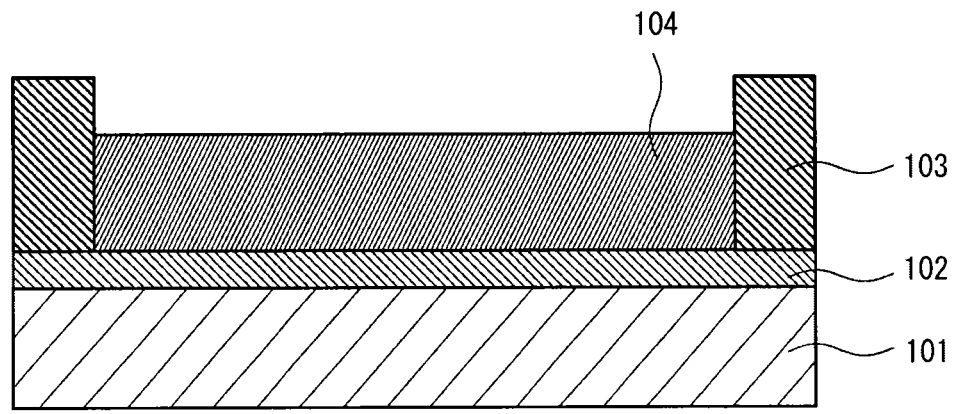
F I G. 3
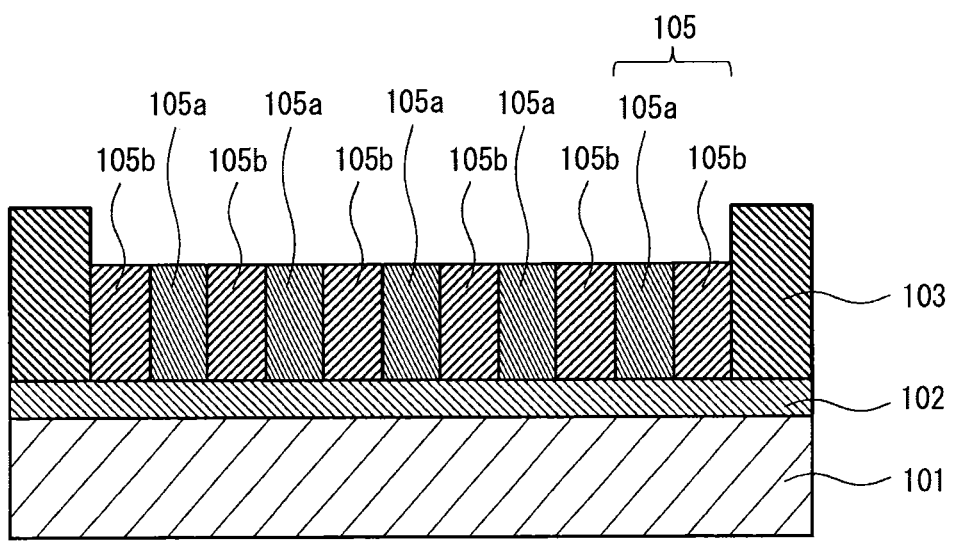
F I G. 4

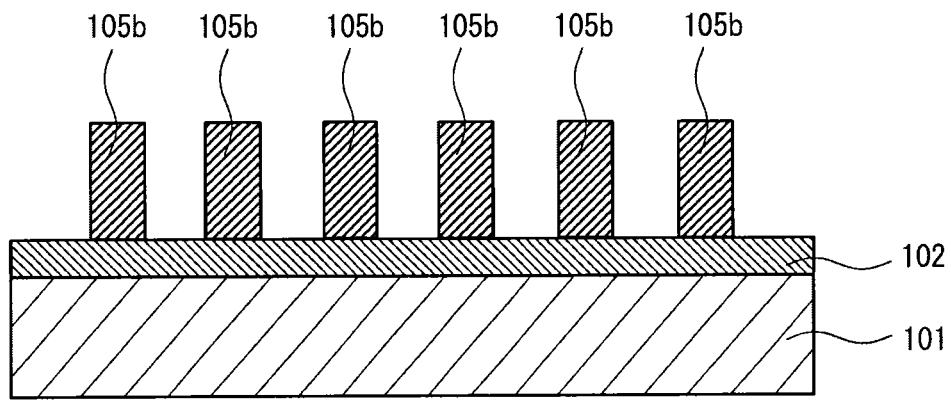
F I G. 5
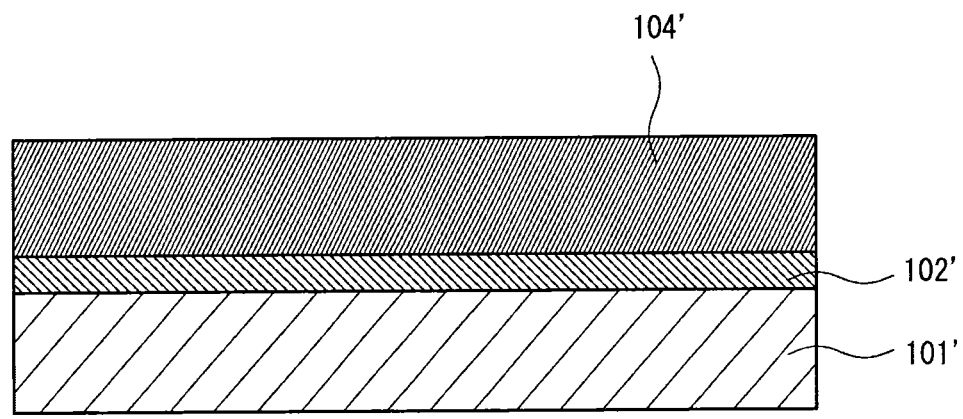
F I G. 6

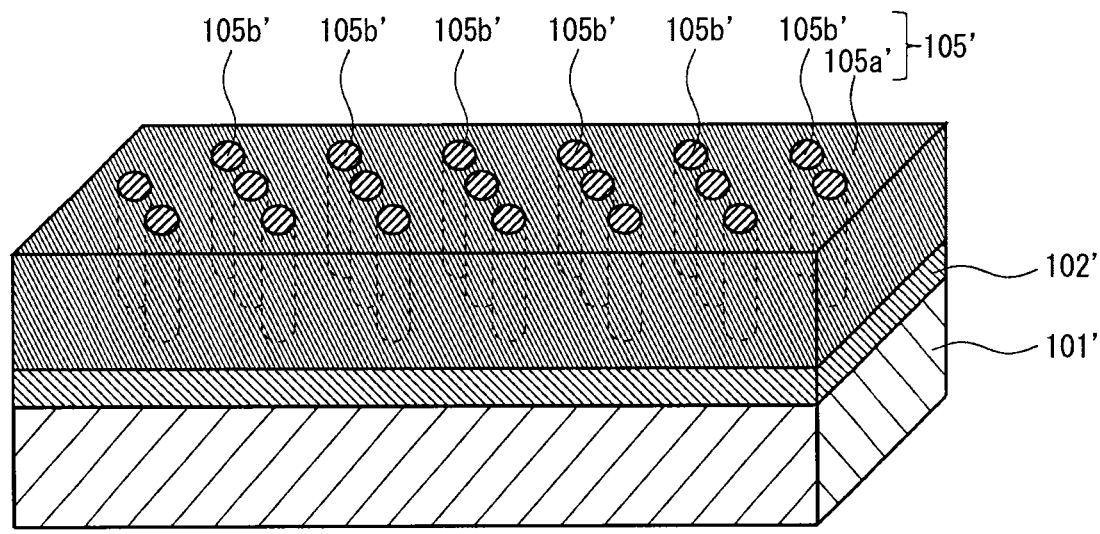
F I G. 1 1
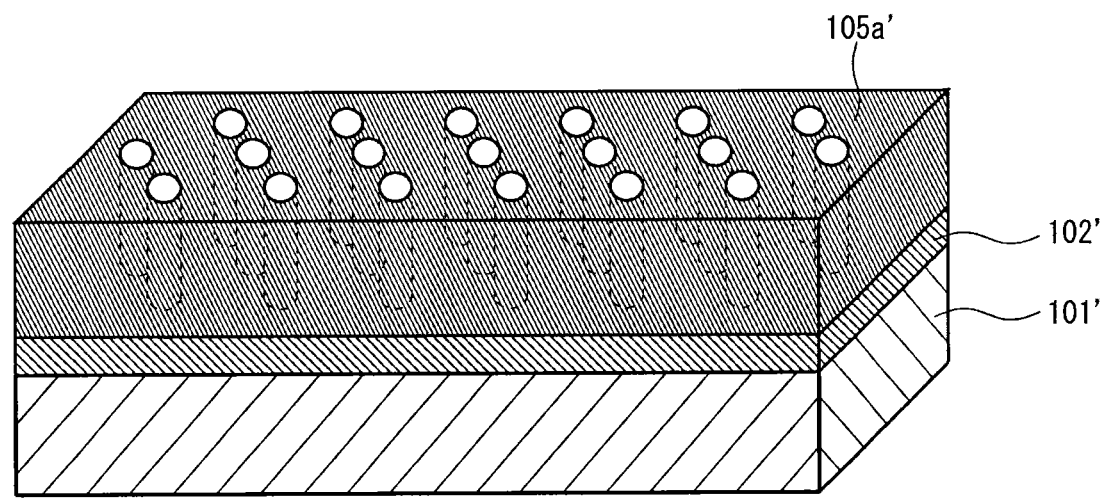
F I G. 1 2

COMPOSITION FOR PATTERN FORMATION, AND PATTERN-FORMING METHOD

CROSS-REFERENCE TO RELATED APPLICATIONS

The present application claims priority to Japanese Patent Application No. 2014-025978, filed Feb. 13, 2014, and to Japanese Patent Application No. 2014-085946, filed Apr. 17, 2014. The contents of these applications are incorporated herein by reference in their entirety.

BACKGROUND OF THE INVENTION

Field of the Invention

The present invention relates to a composition for pattern formation, and a pattern-forming method.

Discussion of the Background

In these days, miniaturization of various types of electronic device structures such as semiconductor devices and liquid crystal devices has been accompanied by demands for miniaturization of patterns in lithography processes. Specifically, although fine patterns having a line width of about 50 nm can be formed using, for example, an ArF excimer laser beam, further finer pattern formation has been required.

To meet the demands described above, some pattern-forming methods which utilize a phase separation structure through the directed self-assembly, as generally referred to, that spontaneously forms an ordered pattern have been proposed. For example, an ultrafine pattern-forming method by directed self-assembly has been known in which a block copolymer obtained by copolymerizing a monomer compound having one property with a monomer compound having a property that is distinct from the one property is involved (see Japanese Unexamined Patent Application, Publication No. 2008-149447, Japanese Unexamined Patent Application (Translation of PCT Application), Publication No. 2002-519728 and Japanese Unexamined Patent Application, Publication No. 2003-218383). According to this method, annealing of a film formed from a composition containing the block copolymer results in a tendency of clustering of polymer structures having the same property, and thus a pattern can be formed in a self-aligning manner.

However, patterns obtained by the abovementioned method are not deemed to be yet sufficiently fine, and therefore the structure and the like of the block copolymer have been variously investigated. In connection with a technology proposed to meet the demands, a copolymer has been known in which a silicon atom is introduced into a part of a plurality of blocks of the block copolymer (see Japanese Unexamined Patent Application (Translation of PCT Application), Publication No. 2013-528664, Japanese Unexamined Patent Application, Publication No. 2013-166932 and ACS Macro Lett., 1, 1279 (2012)).

SUMMARY OF THE INVENTION

According to one aspect of the present invention, a composition for pattern formation includes a block copolymer and a solvent. The block copolymer is capable of forming a phase separation structure through directed self-assembly. The block copolymer includes a first block and a second block. The first block includes a first repeating unit which includes at least two silicon atoms. The second block includes a second repeating unit which does not include a silicon atom. A sum of the atomic weight of atoms constituting the first repeating unit is no greater than 700.

According to another aspect of the present invention, a pattern-forming method includes applying the composition directly or indirectly on a substrate such that a directed self-assembling film having a phase separation structure is provided directly or indirectly on the substrate. The phase separation structure includes a plurality of phase. A part of the plurality of phases of the directed self-assembling film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 1 shows a schematic cross sectional view illustrating one example of a state after providing an underlayer film on a substrate;

FIG. 2 shows a schematic cross sectional view illustrating one example of a state after forming a prepattern on the underlayer film shown in FIG. 1;

FIG. 3 shows a schematic cross sectional view illustrating one example of a state after providing a coating film between facing sides of the prepattern shown in FIG. 2 using a composition for pattern formation;

FIG. 4 shows a schematic cross sectional view illustrating one example of a state after converting the coating film shown in FIG. 3 to a directed self-assembling film;

FIG. 5 shows a schematic cross sectional view illustrating one example of a state after removing a part of a plurality of phases of the directed self-assembling film and the prepattern shown in FIG. 4;

FIG. 6 shows a schematic cross sectional view illustrating one example of a state after providing a coating film on the underlayer film shown in FIG. 1 using the composition for pattern formation;

FIG. 11 shows a schematic perspective view illustrating one example of a state after converting the coating film shown in FIG. 6 to a directed self-assembling film; and FIG. 12 shows a schematic perspective view illustrating one example of a state after removing a part of a plurality of phases of the directed self-assembling film shown in FIG. 11.

DESCRIPTION OF THE EMBODIMENTS

Figure 7:
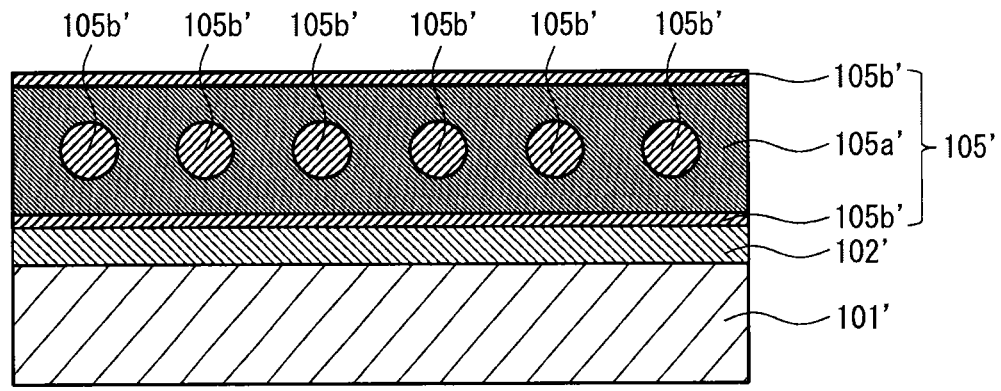
FIG. 7 shows a schematic cross sectional view illustrating one example of a state after converting the coating film shown in FIG. 6 to a directed self-assembling film.

According to an embodiment of the invention made for solving the aforementioned problems, a composition for pattern formation contains: a block copolymer (hereinafter, may be also referred to as "(A) block copolymer" or "block copolymer (A)") that is capable of forming a phase separation structure through directed self-assembly, and has a first block (hereinafter, may be also referred to as "block (a)") including a first repeating unit including a silicon atom (hereinafter, may be also referred to as "repeating unit (I)"), and a second block (hereinafter, may be also referred to as "block (b)") including a second repeating unit not including a silicon atom (hereinafter, "repeating unit (II)"; and a solvent (hereinafter, may be also referred to as "(B) solvent" or "solvent (B)"), wherein the first repeating unit includes 2 or more silicon atoms, and a sum of the atomic weight of atoms constituting the first repeating unit is no greater than 700.

According to another embodiment of the invention made for solving the aforementioned problems, a pattern-forming method includes the steps of: providing a directed self-assembling film having a phase separation structure directly or indirectly on a substrate (hereinafter, may be also referred to as "directed self-assembling film-providing step"); and removing a part of a plurality of phases of the directed self-assembling film (hereinafter, may be also referred to as "removing step"), wherein the directed self-assembling film is provided using the composition for pattern formation of the embodiment of the present invention.

The term "directed self-assembly" or "directed self-assembling" as referred to herein means a phenomenon of spontaneously constructing a tissue or a structure without resulting from only the control from an external factor.

The composition for pattern formation and the pattern-forming method according to the embodiments of the present invention enables a sufficiently fine pattern to be formed while an appropriately short time period for phase separation and a proper coating property are ensured. Therefore, these can be suitably used for lithography processes in manufacture of various types of electronic devices such as semiconductor devices and liquid crystal devices for which further microfabrication is demanded.

Composition for Pattern Formation

The composition for pattern formation according to an embodiment of the present invention contains the block copolymer (A) and the solvent (B). The composition for pattern formation may contain an optional component such as a surfactant, within a range not leading to impairment of the effects of the present invention. A pattern can be formed by providing a film having a phase separation structure achieved through directed self-assembly (directed self-assembling film) directly or indirectly on a substrate using the composition for pattern formation, and removing a part of a plurality of phases of the directed self-assembling film.

Hereinafter, each component will be explained.

(A) Block Copolymer

The block copolymer (A) is capable of forming a phase separation structure through directed self-assembly and has the block (a) and the block (b). Each of the blocks is constituted with a chain structure of a repeating unit derived from a single type of monomer. According to the block copolymer (A) having such a plurality of blocks, a single type of block is aggregated by means of heating or the like, and phases each constituted with the single type of block are formed. In this process, it is presumed that since it is unlikely for phases each formed from a different type of block to mix with each other, a phase separation structure having an ordered pattern can be formed in which different types of phases are periodically and alternately repeated.

According to the composition for pattern formation, due to containing the block copolymer (A) having the block (a) and the block (b), and having the number of silicon atoms in the repeating unit (I) of the block (a) and the sum of the atomic weight of atoms constituting the first repeating unit (I) each falling within the specific range, a sufficiently fine pattern can be formed while an appropriately short time period for phase separation and a proper coating property are ensured. Although not necessarily clarified, the reason for achieving the effects described above due to the composition for pattern formation having the aforementioned constitution is presumed to be, for example, that when the block (a) has an appropriate degree of hydrophobicity and bulkiness, an appropriate difference between the block (a) and the block (b) in terms of physical property is achieved, resulting in concurrent enhancement of a rate of phase separation, a coating property and pattern formability; and the like.

The block copolymer (A) may have one type or a plurality of types of the block (a), and one type or a plurality of types of the block (b).

The block copolymer (A) is exemplified by a diblock copolymer, a triblock copolymer, a tetrablock copolymer, and the like. Of these, a diblock copolymer and a triblock copolymer are preferred, and a diblock copolymer is more preferred in light of the possibility of further facilitated formation of a desired fine pattern.

Moreover, the block copolymer (A) may have a linking group between the blocks.

Hereinafter, each block will be explained.

Block (a)

The block (a) includes the repeating unit (I). The repeating unit (I) includes 2 or more silicon atoms, and a sum of the atomic weight of atoms constituting the repeating unit (I) is no greater than 700.

The lower limit of the number of the silicon atoms included in the repeating unit (I) is 2, preferably 3, and more preferably 4. The upper limit of the number of the silicon atoms is preferably 15, more preferably 10, and still more preferably 7.

When the number of the silicon atoms is 1, the difference between the block (a) and the block (b) in terms of physical property is considered to be less significant, leading to an insufficient phase separation, and a difficulty of forming a sufficiently fine pattern. To the contrary, when the number of the silicon atoms is greater than the upper limit, the difference in terms of physical property between the block (a) and the block (b) is considered to become so significant that formation of a sufficiently fine pattern is difficult.

The upper limit of the sum of the atomic weight of atoms constituting the repeating unit (I) is 700, preferably 600, still more preferably 500, and particularly preferably 450. The lower limit of the sum of the atomic weight is preferably 70, more preferably 100, still more preferably 200, and particularly preferably 300.

When the sum of the atomic weight is less than the lower limit, a time period for phase separation of the block copolymer (A) is likely to be increased. To the contrary, when the sum of the atomic weight is greater than the upper limit, a configuration of a pattern formed through phase separation may be deteriorated.

Although the silicon atoms in the repeating unit (I) may be present in either the main chain or in a side chain, it is preferred that the silicon atoms are present in a side chain. When the silicon atoms in the repeating unit (I) are present in a side chain, the coating property of the composition for pattern formation may be further improved.

The repeating unit (I) is preferably a repeating unit represented by the following formula (1) (hereinafter, may be also referred to as "repeating unit (I-1)").

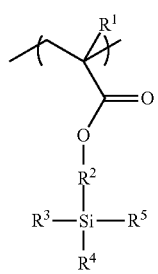

(1)

In the above formula (1), $R^1$ represents a hydrogen atom or a methyl group; $R^2$ represents a divalent hydrocarbon group having 1 to 10 carbon atoms; $R^3$, $R^4$ and $R^5$ each independently represent a hydrogen atom, a monovalent hydrocarbon group having 1 to 10 carbon atoms, —SiR'$_3$, —Si$_2$R'$_5$ or —OSiR'$_3$, or two of $R^3$, $R^4$ and $R^5$ taken together represent a ring structure having 3 to 10 ring atoms together with the silicon atom to which the two of $R^3$, $R^4$ and $R^5$ bond, and the rest of $R^3$, $R^4$ and $R^5$ represents a hydrogen atom, a monovalent hydrocarbon group having 1 to 10 carbon atoms, —SiR'$_3$, —Si$_2$R'$_5$ or —OSiR'$_3$; and R's each independently represent a hydrogen atom or a monovalent hydrocarbon group having 1 to 10 carbon atoms, wherein at least one of $R^3$, $R^4$ and $R^5$ represent —SiR'$_3$, —Si$_2$R'$_5$ or —OSiR'$_3$, and wherein a sum of the number of carbon atoms included in $R^3$, $R^4$ and $R^5$ is no greater than 20.

$R^1$ preferably represents a methyl group in light of a degree of copolymerization of a monomer that gives the repeating unit (I-1).

The divalent hydrocarbon group having 1 to 10 carbon atoms represented by $R^2$ is exemplified by a divalent chain hydrocarbon group having 1 to 10 carbon atoms, a divalent alicyclic hydrocarbon group having 3 to 10 carbon atoms, a divalent aromatic hydrocarbon group having 6 to 10 carbon atoms, and the like.

Examples of the divalent chain hydrocarbon group include:
alkanediyl groups such as a methanediyl group, an ethanediyl group, a propanediyl group and a butanediyl group;
alkenediyl group such as an ethenediyl group and a propenediyl group;
alkynediyl groups such as an ethynediyl group and a propynediyl group; and the like.

Examples of the divalent alicyclic hydrocarbon group include:
cycloalkanediyl groups such as a cyclopentanediyl group and a cyclohexanediyl group;
cycloalkenediyl groups such as a cyclopentenediyl group and a cyclohexenediyl group; and the like.

Examples of the divalent aromatic hydrocarbon group include:
arenediyl groups such as a benzenediyl group, a toluenediyl group and a naphthalenediyl group;
arenediylalkanediyl groups such as a benzenediylmethanediyl group and a benzenediylethanediyl group; and the like.

$R^2$ represents preferably a divalent chain hydrocarbon group, more preferably an alkanediyl group, still more preferably an alkanediyl group having 2 to 4 carbon atoms, and particularly preferably a propanediyl group.

The monovalent hydrocarbon group having 1 to 10 carbon atoms which may be represented by $R^3$, $R^4$ and $R^5$ is exemplified by a monovalent chain hydrocarbon group having 1 to 10 carbon atoms, a monovalent alicyclic hydrocarbon group having 3 to 10 carbon atoms, a monovalent aromatic hydrocarbon group having 6 to 10 carbon atoms, and the like. Examples of these groups include groups obtained from the groups exemplified as the divalent hydrocarbon group represented by $R^2$ by incorporating one hydrogen atom thereinto, and the like.

Of these, monovalent chain hydrocarbon groups are preferred, alkyl groups are more preferred, alkyl groups having 1 to 4 carbon atoms are still more preferred, and a methyl group and an ethyl group are particularly preferred.

Examples of the monovalent hydrocarbon group having 1 to 10 carbon atoms which may be represented by R' in —SiR'$_3$, —Si$_2$R'$_5$ and —OSiR'$_3$ include groups identical to groups exemplified as the monovalent hydrocarbon group having 1 to 10 carbon atoms which may be represented by $R^3$, $R^4$ and $R^5$, and the like.

R' represents preferably a monovalent chain hydrocarbon group, more preferably an alkyl group, still more preferably an alkyl group having 1 to 4 carbon atoms, and particularly preferably a methyl group or an ethyl group.

The ring structure having 3 to 10 ring atoms taken together represented by two of $R^3$, $R^4$ and $R^5$ together with the silicon atom to which the two of $R^3$, $R^4$ and $R^5$ bond is exemplified by a ring structure having 2 to 5 —Si—O—, and the like.

The sum of the number of carbon atoms included in $R^3$, $R^4$ and $R^5$ is no greater than 20, and preferably no greater than 18.

Examples of the repeating unit (I-1) include repeating units represented by the following formulae (1-1) to (1-12) (hereinafter, may be also referred to as "repeating units (I-1-1) to (I-1-12)"), and the like.

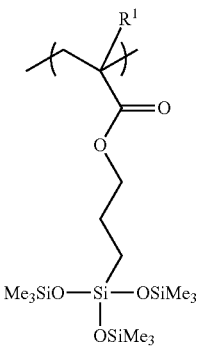

(1-1)

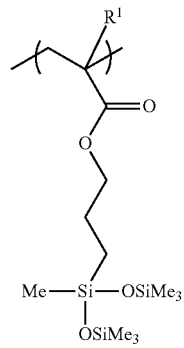

(1-2)

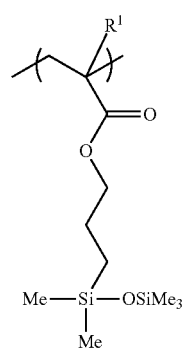 (1-3)
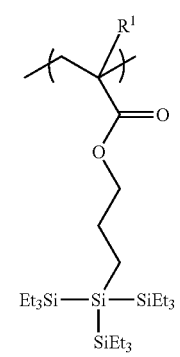 (1-4)
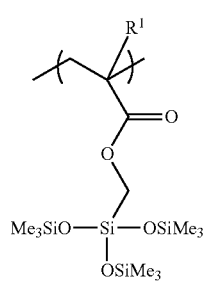 (1-5)
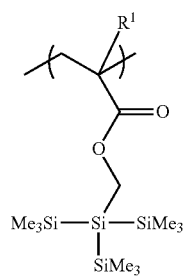 (1-6)
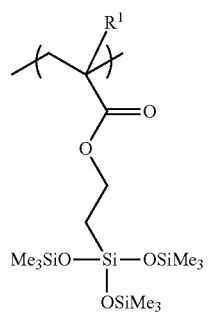 (1-7)
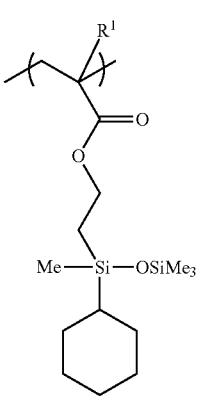 (1-8)
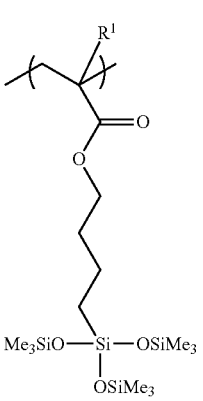 (1-9)
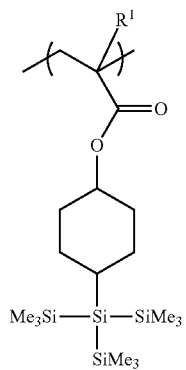 (1-10)
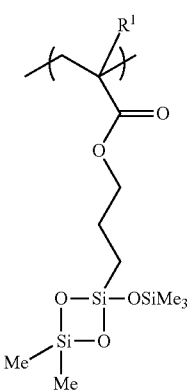 (1-11)

-continued (1-12)
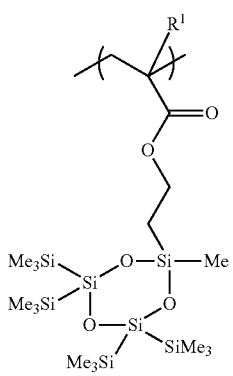

In the above formulae (1-1) to (1-12), $R^1$ is as defined in the above formula (1).

The repeating unit (I) is also exemplified by repeating units represented by the following formulae (2-1) to (2-8) (hereinafter, may be also referred to as "repeating units (I-2-1) to (I-2-8)"), and the like.

(2-1)
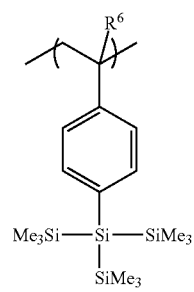

(2-2)
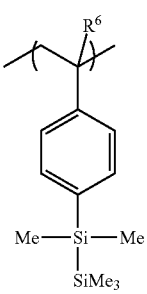

(2-3)
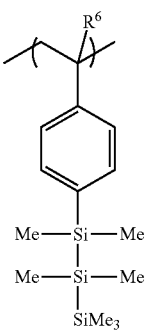

-continued (2-4)
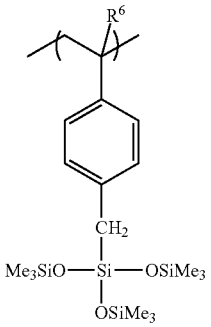

(2-5)
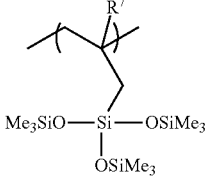

(2-6)
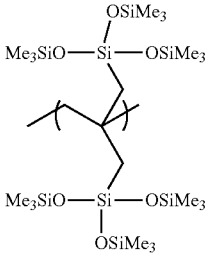

(2-7)
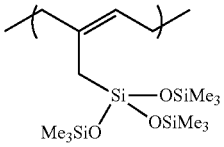

(2-8)

In the above formulae (2-1) to (2-4), $R^6$ represents a hydrogen atom or a methyl group.

In the above formula (2-5), $R^7$ represents a hydrogen atom or a methyl group.

As the repeating unit (I), the repeating units (I-1-1) to (I-1-4) are preferred.

Block (b)

The block (b) includes the repeating unit (II). The repeating unit (II) does not include a silicon atom.

The block (b) is exemplified by a polystyrene block, a poly(meth)acrylic acid ester block, a polyvinyl acetal block, a polyurethane block, a polyurea block, a polyimide block, a polyamide block, an epoxy block, a novolak-type phenol block, a polyester block, and the like.

The block (b) is preferably a polystyrene block or a poly(meth)acrylic acid ester block in light of the possibility of facilitated formation of the phase separation structure and an ease of the removal of the phases.

The polystyrene block includes the repeating unit (II) constituted with an unsubstituted or substituted styrene unit.

Examples of a monomer that gives the unsubstituted or substituted styrene unit include: styrene; and substituted styrenes, for example, α-methylstyrene, styrenes substituted with an electron-donating group such as o-, m- or p-methylstyrene, p-t-butylstyrene, 2,4,6-trimethyl styrene, p-methoxystyrene, p-t-butoxystyrene, o- and m- or p-vinylstyrene, and styrenes substituted with an electron attractive group such as o-, m- or p-hydroxystyrene, m- or p-chloromethylstyrene, p-chlorostyrene, p-bromostyrene, p-iodostyrene, p-nitrostyrene and p-cyanostyrene. These monomers may be a mixture of two or more types thereof.

Of these, styrenes substituted with an electron-donating group are preferred, and p-t-butylstyrene is more preferred in light of attaining a more favorable phase separation through the directed self-assembly. Alternatively, styrenes substituted with an electron attractive group are preferred, and m- or p-chloromethylstyrene is more preferred in light of attaining a more stable polymerization reaction.

The poly(meth)acrylic acid ester block includes the repeating unit (II) constituted with a (meth)acrylic acid ester unit. Examples of a monomer that gives the (meth)acrylic acid ester unit include:

(meth)acrylic acid alkyl esters such as methyl (meth)acrylate, ethyl (meth)acrylate, t-butyl (meth)acrylate and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate and 2-(adamantan-1-yl)propyl (meth)acrylate;

(meth)acrylic acid aryl esters such as phenyl (meth)acrylate and naphthyl (meth)acrylate;

substituted alkyl esters of (meth)acrylic acid such as 2-hydroxyethyl (meth)acrylate, 3-hydroxyadamantyl (meth)acrylate and 3-glycidylpropyl (meth)acrylate; and the like.

These monomers maybe a mixture of two or more types thereof.

When the block (b) is the poly(meth)acrylic acid ester block, a pattern exhibiting fewer defects can be formed. It is believed that this effect is exerted since the (meth)acrylic acid ester can serve in allowing an anionic polymerization reaction and the like to stably proceed, the formation of a polymer including only the block (b) is inhibited, consequently leading to a decrease of a value of the molecular weight distribution (Mw/Mn) of the resulting block copolymer (A). Moreover, when the block (b) is the poly(meth)acrylic acid ester block, the coating property of the composition for pattern formation and the etching selectivity of the directed self-assembling film can be both improved, resulting in an improvement of both pattern formability and a pattern height achieved after the pattern formation.

The monomer that gives the poly(meth)acrylic acid ester unit is preferably a (meth)acrylic acid alkyl ester, and more preferably methyl (meth)acrylate in light of a further improvement of pattern formability and a pattern height after pattern formation.

The molar ratio ((I)/(II)) of the repeating unit (I) to the repeating unit (II) included in the block copolymer (A) may be appropriately selected in accordance with a line/space width ratio of a desired line-space pattern, dimensions of a contact hole pattern or a cylinder pattern, and the like. However, in light of the possibility of formation of a finer and more favorable pattern, the molar ratio ((I)/(II)) is preferably no less than 20/80 and no greater than 80/20, and more preferably no less than 35/65 and no greater than 65/35 in the case of the formation of a line-and-space pattern. Alternatively, in the case of the formation of a contact hole pattern or a cylinder pattern, the molar ratio ((I)/(II)) is preferably no less than 10/90 and no greater than 90/10, and more preferably no less than 20/80 and no greater than 80/20.

Linking Group

The block copolymer (A) may have a linking group between adjacent blocks among the blocks (a) and the blocks (b). When the block copolymer (A) has the linking group, the phase separation ability thereof may be improved, and the formed pattern may be further miniaturized.

Examples of such a linking group include divalent organic groups having 1 to 50 carbon atoms, and the like.

A monomer that gives the linking group is exemplified by diphenylethylene, and the like. Diphenylethylene and the like can stabilize an anionic terminal formed in the course of the synthesis of the block copolymer (A) by anionic polymerization, and consequently a dispersity index of the resulting block copolymer (A) can be minimized, leading to a decrease of variations of the dimensions of the formed pattern. The block copolymer (A) may have one type of the linking group or two or more types thereof.

Synthesis Method of Block Copolymer (A)

The block copolymer (A) can be synthesized through, for example, living cationic polymerization, living anionic polymerization, living radical polymerization, coordination polymerization (using a Ziegler-Natta catalyst or a metallocene catalyst), and the like, and for example, can be synthesized by linking a block (a) and a block (b) through polymerization in a desired order. Of these, living anionic polymerization is more preferred in light of an improvement of a configuration of a pattern.

With respect to synthesis of the block copolymer (A) by anionic polymerization, in a case where, for example, a diblock copolymer constituted with the block (a) and the block (b) is synthesized, a monomer that gives the block (a), for example, is first polymerized in an appropriate solvent using an anionic polymerization initiator to form the block (a). Next, a monomer that gives the block (b) is similarly added to form the block (b) so as to connect to the block (a). A linking group may be provided between the block (a) and the block (b) through a reaction of diphenylethylene or the like.

Examples of a solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, 2-butanone, 4-methyl-2-pentanone, 2-heptanone and cyclohexanone;

ethers such as tetrahydrofuran, dimethoxyethanes and diethoxyethanes; and the like. These solvents may be used either alone, or two or more types thereof may be used in combination.

Although the reaction temperature in the polymerization may be appropriately selected in accordance with the type of an initiator, the reaction temperature is typically −150° C. to 50° C., and preferably −80° C. to 40° C. The reaction time period is typically 5 min to 24 hrs, and preferably 20 min to 12 hrs.

The initiator for use in the polymerization is exemplified by an alkyllithium, an alkylmagnesium halide, naphthalene sodium, an alkylated lanthanoid compound; a potassium alkoxide such as potassium t-butoxide and 18-crown-6-ether potassium; an alkylzinc such as dimethylzinc and diethylzinc; an alkylaluminum such as trimethylaluminum; an aromatic metal compound such as benzylpotassium, cumylpotassium and cumylcesium; and the like. Of these, in the case where the polymerization is executed using styrene or methyl methacrylate as a monomer, an alkyllithium compound is preferably used.

The block copolymer (A) is preferably recovered through a reprecipitation procedure. More specifically, after completion of the reaction, the intended copolymer is recovered in the form of a powder through charging the reaction liquid into a reprecipitation solvent. As the reprecipitation solvent, alcohols, ultra pure water, alkanes and the like may be used either alone or as a mixture of two or more types thereof. Alternative to the reprecipitation procedure, a liquid separating operation, a column operation, an ultrafiltration operation or the like also enables the polymer to be recovered through eliminating low molecular components such as monomers and oligomers.

The weight average molecular weight (Mw) of the block copolymer (A) as determined by gel permeation chromatography (GPC) is preferably 5,000 to 80,000, more preferably 8,000 to 70,000, and still more preferably 10,000 to 50,000. When the Mw of the block copolymer (A) falls within the above range, the composition for pattern formation enables a more sufficiently fine pattern to be formed.

The number average molecular weight (Mn) of the block copolymer (A) as determined by gel permeation chromatography (GPC) is preferably 4,500 to 70,000, more preferably 7,000 to 60,000, and still more preferably 9,000 to 40,000. When the Mn of the block copolymer (A) falls within the above range, the composition for pattern formation enables a more sufficiently fine pattern to be formed.

The dispersity index (Mw/Mn) of the block copolymer (A) is typically 1 to 5, preferably 1 to 3, more preferably 1 to 2, still more preferably 1 to 1.5, particularly preferably 1 to 1.2, and more particularly preferably 1 to 1.1. When the dispersity index falls within the above range, the composition for pattern formation enables a still more sufficiently fine pattern to be formed.

It is to be noted that the Mw and the Mn are determined by gel permeation chromatography (GPC) using GPC columns ("G2000HXL"×2, "G3000HXL"×1, and "G4000HXL"×1; available from Tosoh Corporation), a differential refractometer as a detector, and mono-dispersed polystyrene as a standard, under the analytical conditions involving: flow rate of 1.0 mL/min; an elution solvent of tetrahydrofuran; a sample concentration of 1.0% by mass; an amount of the sample injected of 100 μm; and a column temperature of 40° C.

The content of the block polymer (A) with respect to the total solid content of the composition for pattern formation is preferably no less than 80% by mass, more preferably no less than 90% by mass, and still more preferably no less than 95% by mass.

(B) Solvent

The composition for pattern formation contains the solvent (B). The solvent (B) is not particularly limited, as long as it can dissolve or disperse at least the block copolymer (A).

The solvent (B) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone:

cyclic ketone solvents such as cyclopentanone, cyclohexanone, cycloheptanone, cyclooctanone and methylcyclohexanone:

2,4-pentanedione, acetonylacetone, and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partially etherated acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

lactone solvents such as γ-butyrolactone and valerolactone;

carbonate solvents such as dimethyl carbonate, diethyl carbonate, ethylene carbonate and propylene carbonate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate, and diethyl phthalate; and the like.

Examples of the hydrocarbon solvent include:

aliphatic hydrocarbon solvents such as n-pentane, isopentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ester solvent and the ketone solvent are preferred, the ester solvent is more preferred, polyhydric alcohol partially etherated acetate solvent is still more preferred, and propylene glycol monomethyl ether acetate is particularly preferred. The composition for pattern formation may contain one type of the solvent (B), or two or more types thereof.

Optional Component

The composition for pattern formation may contain optional component(s) in addition to the block copolymer (A) and the solvent (B). The optional component(s) is/are exemplified by a surfactant and the like. When the composition for pattern formation contains the surfactant, the coating property onto a substrate or the like may be improved.

Pattern-Forming Method

The pattern-forming method according to another embodiment of the present invention includes the directed self-assembling film-providing step and the removing step. The pattern-forming method may further include, before the directed self-assembling film-providing step, the step of providing an underlayer film directly or indirectly on the substrate (hereinafter, may be also referred to as "underlayer film-providing step") and/or the step of forming a prepattern directly or indirectly on the substrate (hereinafter, may be also referred to as "prepattern-forming step").

Hereinafter, each step will be described with reference to the drawings.

Underlayer Film-Providing Step

In this step, an underlayer film is provided directly or indirectly on a substrate. Thus, as shown in FIG. 1, a substrate having an underlayer film can be obtained which includes an underlayer film 102 provided on a substrate 101, and the directed self-assembling film is provided on the underlayer film 102. The phase separation structure (microdomain structure) included in the directed self-assembling film is altered by not only an interaction between blocks of the block copolymer (A) contained in the composition for pattern formation, but also an interaction with the underlayer film 102; therefore, the structure may be more easily controlled by virtue of having the underlayer film 102. Furthermore, when the directed self-assembling film is thin, a transfer process thereof can be improved owing to having the underlayer film 102.

As the substrate 101, for example, a conventionally well-known substrate, e.g., a silicon wafer, a wafer coated with aluminum, or the like may be used.

As the composition for forming an underlayer film for use in providing the underlayer film, a conventionally well-known organic material for forming an underlayer film, and the like may be used, and examples thereof include compositions for forming an underlayer film that contains a crosslinking agent, and the like. Moreover, since the composition for pattern formation contains the block copolymer (A) including the silicon atom, a composition that contains a polymer including a silicon atom may also be preferably used as the composition for forming an underlayer film, and examples thereof include compositions for forming an underlayer film that contains a polymer having a silicon atom-containing structural unit, a polysiloxane, a polysiloxane-grafted polymer, or the like, etc.

Although the procedure for providing the underlayer film 102 is not particularly limited, an exemplary procedure may involve, for example, coating the composition for forming an underlayer film on the substrate 101 through a well-known method such as a spin coating method, followed by an exposure and/or heating to permit curing of the composition for forming an underlayer film, and the like. Examples of the radioactive ray which may be employed for the exposure include visible light rays, ultraviolet rays, far ultraviolet rays, X-rays, electron beams, γ-rays, molecular beams, ion beams, and the like. Moreover, the temperature employed during the heating is not particularly limited, and is preferably 90° C. to 550° C., more preferably 90° C. to 450° C., and still more preferably 90° C. to 300° C. The time period of the heating is preferably 5 sec to 1,200 sec, more preferably 10 sec to 600 sec, and still more preferably 20 sec to 300 sec. The film thickness of the underlayer film 102 is not particularly limited, and is preferably 1 nm to 20,000 nm, more preferably 2 nm to 1,000 nm, and still more preferably 3 nm to 100 nm.

Prepattern-Forming Step

According to this step, the prepattern is formed. This prepattern may be formed on the substrate, or may be formed on the underlayer film 101 provided in the underlayer film-providing step as shown in FIG. 2. The prepattern 103 enables a configuration of the phase separation structure attained through the directed self-assembly in the coating film 104 to be controlled, and thus a finer pattern can be formed. More specifically, among the blocks included in the block copolymer (A) contained in the composition for pattern formation, a block having a higher affinity to a lateral face of the prepattern (may be also referred to as "block (β)") forms phases 105b along the prepattern, whereas a block having a lower affinity (may be also referred to as "block (α)") forms phases 105a at positions away from the prepattern. Accordingly, a finer and more favorable pattern can be formed. In addition, according to the material, size, shape, etc. of the prepattern, the structure of the pattern formed through phase separation of the composition for pattern formation can be more closely controlled. It is to be noted that the prepattern 103 may be appropriately selected depending on the pattern intended to be finally formed, and, for example, a line-and-space pattern, a hole pattern, a cylinder pattern and the like may be employed.

As the method for forming the prepattern 103, those similar to well-known resist pattern-forming methods, and the like may be used. In addition, a conventional resist composition such as a composition that contains a polymer including an acid-labile group, a radiation-sensitive acid generating agent and an organic solvent may be used as the composition for use in forming the prepattern 103. Specifically, for example, a commercially available chemical amplification resist composition is coated on the substrate 101 or the underlayer film 102 to provide a resist film. Next, an exposure is carried out by irradiating a desired region of the resist film with a radioactive ray through a mask having a specific pattern. Examples of the radioactive ray include: electromagnetic waves such as ultraviolet rays, far ultraviolet rays and X-rays; charged particle rays such as electron beams and α-rays; and the like. Of these, far ultraviolet rays are preferred, ArF excimer laser beams and KrF excimer laser beams are more preferred, and ArF excimer laser beams are still more preferred. Also, the exposure may employ a liquid immersion medium. Subsequently, post exposure baking (PEB) is carried out, followed by development using a developer solution such as an alkaline developer solution and an organic solvent, whereby a desired prepattern 103 can be formed. In the resulting prepattern 103, it is preferred that curing is accelerated by irradiation with an ultraviolet ray of, for example, 254 nm, followed by a heating treatment at 100° C. to 200° C. for 1 min to for 30 min.

It is to be noted that the surface of the prepattern 103 may be subjected to a hydrophobilization treatment or a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables the directed self-assembly in the coating film 104 to be further accelerated.

Directed Self-Assembling Film-Providing Step

In this step, a directed self-assembling film having a phase separation structure is provided directly or indirectly on a substrate using the composition for pattern formation. In a case where the underlayer film and the prepattern are not used, the composition for pattern formation is directly coated on the substrate to give a coating film, whereby the directed self-assembling film having a phase separation structure is provided. Alternatively, in a case where the underlayer film and the prepattern are used, as shown in FIG. 3, the composition for pattern formation is coated on a region surrounded by the prepattern 103 on the underlayer film 102 to give the coating film 104, and directed self-assembly in the coating film 104 enables a directed self-assembling film having a phase separation structure to be provided on the underlayer film 102 provided on the substrate 101. The directed self-assembling film to be provided is exemplified by a film having a phase separation structure having an interface substantially perpendicular to the substrate 101, e.g., the directed self-assembling film 105 shown in FIG. 4, and the like. Coating on the substrate the composition for pattern formation that contains the block copolymer (A) including two or more types of blocks incompatible with one another, followed by annealing and the like allows blocks having identical properties to be assembled with one another to spontaneously form an ordered pattern, and thus enables directed self-assembly, as generally referred to, to be accelerated. Accordingly, a directed self-assembling film having a phase separation structure such as a sea-island structure, a cylinder structure, a co-interconnected or a lamellar structure can be formed. Examples of the directed self-assembling film having a phase separation structure with a cylinder structure include a directed self-assembling film 105' having matrix phases 105a' and cylindrical phases 105b', in which the axis of symmetry of the cylindrical phase is oriented substantially parallel to the substrate 101', as shown in FIG. 7, and the like. In particular, when the composition for pattern formation according to the embodiment of the present invention is used, providing the coating film 104' without a need to provide the prepattern, as shown in FIG. 6, and permitting the directed self-assembly in the coating film 104 allows a directed self-assembling film 105' to be easily formed having the cylindrical phases 105b' formed from the block (a) and the matrix phases 105a' formed from the block (b), as shown in FIG. 7, each block being derived from the copolymer (A). Note that the phase formed from the block (a) in this step may be also formed on the superficial layer portion of the directed self-assembling film 105'. Moreover, the directed self-assembling film having a phase separation structure with the cylinder structure is also exemplified by a directed self-assembling film 105' having the matrix phases 105a' and the cylindrical phases 105b', in which the axis of symmetry of the cylindrical phase is oriented substantially perpendicular to the substrate 101', as shown in FIG. 11. In particular, when the composition for pattern formation according to the embodiment of the present invention is used, providing the coating film 104' without a need to provide the prepattern, and permitting the directed self-assembly in the coating film allows a directed self-assembling film 105' to be easily formed having the cylindrical phases 105b' formed from the block (b) and the matrix phases 105a' formed from the block (a), as shown in FIG. 11, each block being derived from the copolymer (A). In this step, the use of the composition for pattern formation according to the embodiment of the present invention enables occurrence of phase separation to be facilitated, and therefore a finer phase separation structure (microdomain structure) can be formed.

When the prepattern is included, the phase separation structure is preferably formed along the prepattern, and the interface formed by the phase separation is more preferably substantially parallel to a lateral face of the prepattern. For example, in formation of the phase separation structure shown in FIG. 4, when the prepattern 103 has a higher affinity to the block (b) of the block copolymer (A), a phase (105b) of the block (b) is linearly formed along the prepattern 103, and adjacent to the phase (105b), a phase (105a) of the block (a) and the phase (105b) of the block (b) are alternately arranged in this order to form a lamellar phase separation structure, or the like. It is to be noted that the phase separation structure formed in this step is configured with a plurality of phases, and the interface formed by these phases is substantially perpendicular to or substantially parallel to the substrate; however, the interface per se may not necessarily be clear. In addition, the resultant phase separation structure can be more strictly controlled by way of a ratio of the length of each block in molecules of the block copolymer (A), the length of the molecule of the block copolymer (A) (weight average molecular weight, etc.), the underlayer film, the prepattern and the like, and thus, a directed self-assembling film having a phase separation structure such as a sea-island structure, a cylinder structure, a co-interconnected or a lamellar structure can be formed; consequently, a desired fine pattern can be obtained.

Although the procedure for providing the coating film 104 by coating the composition for pattern formation directly or indirectly on a substrate is not particularly limited, for example, a procedure in which the composition for pattern formation employed is coated by spin coating etc., and the like may be involved. Accordingly, a space between facing sides of the prepattern 103 on the underlayer film 102 is filled with the composition for pattern formation.

Examples of the procedure for converting the coating film to a directed self-assembling film through phase separation include annealing, and the like.

The annealing process may include, for example, heating at a temperature of typically 80° C. to 400° C., more preferably 100° C. to 350° C., and still more preferably 150° C. to 300° C. in an oven, on a hot plate, etc., and the like. The annealing time period is preferably 10 sec to 120 min, more preferably 20 sec to 10 min, and still more preferably 30 sec to 5 min. When a lamellar pattern is formed, a longer annealing time period can increase the proportion of the line pattern involved. The film thickness of the resulting directed self-assembling film 105 is preferably 0.1 nm to 500 nm, more preferably 1 nm to 100 nm, and still more preferably 5 nm to 50 nm.

Removing Step

Figure 8:
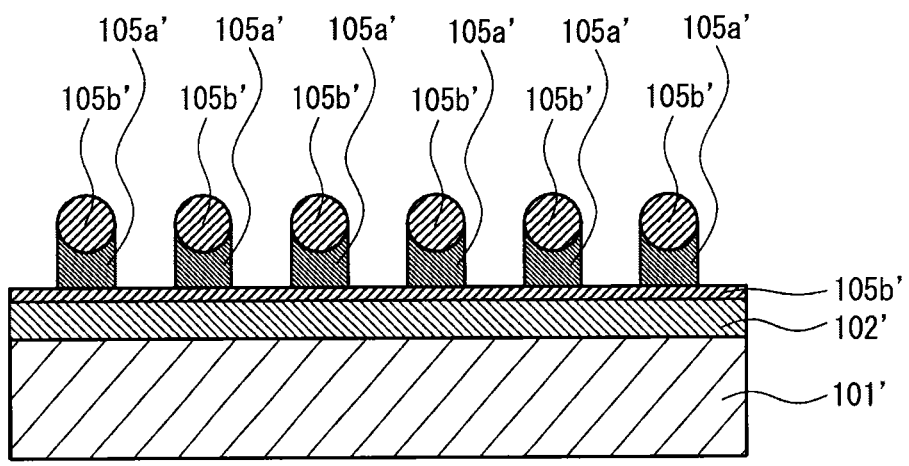
FIG. 8 shows a schematic cross sectional view illustrating one example of a state after removing a part of a plurality of phases of the directed self-assembling film shown in FIG. 7.

According to this step, as shown in FIG. 5, a part of a plurality of block phases 105a are removed, for example, from the directed self-assembling film 105 shown in FIG. 4, by utilizing, for example, the difference of an etching rate of each phase separated through the directed self-assembly. As shown in FIG. 8, a part of a plurality of phases 105a' are removed from the directed self-assembling film 105' shown in FIG. 7. As shown in FIG. 12, a part of a plurality of phases 105b' are removed from the directed self-assembling film 105' shown in FIG. 11. Moreover, the prepattern 103 may be removed concurrently with or separately from a part of the plurality of phases. A state after removing a part of the plurality of phases 105a of the phase separation structure shown in FIG. 4, and the prepattern 103 as described later, is shown in FIG. 5. It is to be noted that prior to the etching treatment, irradiation with a radioactive ray may be conducted as needed. As the radioactive ray, in a case where the phases to be removed by etching are phases of the polymethyl methacrylate block, a radioactive ray of 254 nm may be used. The irradiation with the radioactive ray results in decomposition of the phases of the polymethyl methacrylate block, whereby the etching cab be facilitated.

As the procedure for removing a part of the plurality of phases of the phase separation structure included in the directed self-assembling film 105, well-known procedures e.g., reactive ion etching (RIE) such as chemical dry etching and chemical wet etching; physical etching such as sputter etching and ion beam etching; and the like may be exemplified. Of these, reactive ion etching (RIE) is preferred, and chemical dry etching carried out by using $CF_4$, an $O_2$ gas or the like, and chemical wet etching (wet development) carried out by using an etching liquid, i.e., an organic solvent, or a liquid such as hydrofluoric acid are more preferred. Examples of the organic solvent include: alkanes such as n-pentane, n-hexane and n-heptane; cycloalkanes such as cyclohexane, cycloheptane and cyclooctane; saturated carboxylic acid esters such as ethyl acetate, n-butyl acetate, i-butyl acetate and methyl propionate; ketones such as acetone, methyl ethyl ketone, methyl isobutyl ketone and methyl n-pentyl ketone; alcohols such as methanol, ethanol, 1-propanol, 2-propanol and 4-methyl-2-pentanol; and the like. It is to be noted that these solvents may be used either alone, or two or more types thereof may be used in combination.

Removing the matrix phases 105a' of the directed self-assembling film 105' shown in FIG. 7 by chemical dry etching carried out by using $CF_4$, an $O_2$ gas or the like (however, the matrix phases 105a' under the phase 105b' not being removed) allows a line-and-space pattern to be obtained, as shown in FIG. 8. Removing the cylindrical phases 105b' of the directed self-assembling film 105' shown in FIG. 11 by chemical dry etching carried out by using $CF_4$, an $O_2$ gas or the like allows a hole pattern to be obtained, as shown in FIG. 12.

Prepattern Removing Step

In this step, the prepattern 103 is removed as shown in FIGS. 4 and 5. Removal of the prepattern 103 enables a finer and complicated pattern to be formed. It is to be noted that with respect to the procedure for removing the prepattern 103, the procedure described in connection with the procedure for removing a part of the plurality of phases of the phase separation structure may be employed. Also, this step may be carried out concomitantly with the removing step, or may be carried out before or after the removing step.

Substrate Pattern Formation Step

The pattern-forming method preferably further includes the substrate pattern formation step after the removing step. In this step, using a part of the residual directed self-assembling film (a pattern configured with the phases 105b shown in FIG. 5, a pattern including the phases 105b' shown in FIG. 8, or a pattern configured with phases 105a' shown in FIG. 12) as a mask, the silicon atom-containing film and the substrate are etched to permit patterning. After completion of the patterning onto the substrate, the phases used as a mask are removed from the substrate by a dissolving treatment or the like, whereby a patterned substrate (pattern) can be finally obtained. Examples of the resultant pattern include line-and-space patterns, hole patterns, and the like. As the procedure for the etching, the procedure similar to those in the removing step may be employed, and the etching gas and the etching liquid may be appropriately selected in accordance with the materials of the silicon atom-containing film and the substrate. For example, in a case where the substrate is a silicon material, a gas mixture of chlorofluorocarbon-containing gas and $SF_4$, or the like may be used. Alternatively, in a case where the substrate is a metal film, a gas mixture of $BCl_3$ and $Cl_2$, or the like may be used. The pattern obtained according to the pattern-forming method is suitably used for semiconductor elements and the like, and further the semiconductor elements are widely used for LED, solar cells, and the like.

EXAMPLES

Hereinafter, the present invention is explained in detail by way of Examples, but the present invention is not in any way limited to Examples. Measuring methods for various types of physical properties are shown below.

Mw and Mn

The Mw and the Mn of the polymer were determined by gel permeation chromatography (GPC) using GPC columns (Tosoh Corporation; "G2000HXL"×2, "G3000HXL"×1 and "G4000HXL"×1) under the following conditions:

eluent: tetrahydrofuran (Wako Pure Chemical Industries, Ltd.);

flow rate: 1.0 mL/min;

sample concentration: 1.0% by mass;

amount of sample injected: 100 μL;

column temperature: 40° C.;

detector: differential refractometer; and standard substance: mono-dispersed polystyrene.

$^1$H-NMR Analysis

$^1$H-NMR analysis was carried out using a nuclear magnetic resonance apparatus ("JNM-EX400" available from JEOL, Ltd.), with DMSO-$d_6$ for use as a solvent for measurement. The proportion of each repeating unit in the polymer was calculated from an area ratio of a peak corresponding to each repeating unit on the spectrum obtained by the $^1$H-NMR.

Synthesis of Polymers

Synthesis of Block Copolymers (A)

Monomers used in the synthesis of the block copolymers (A) are shown below.

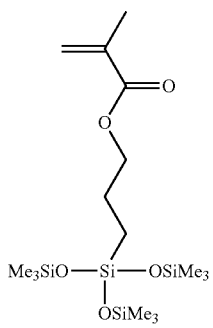
(M-1)

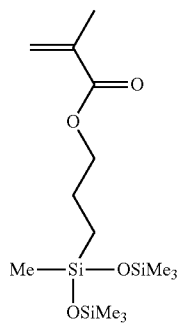
(M-2)

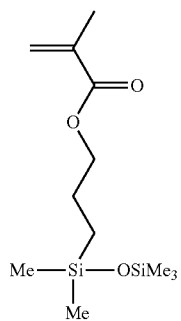
(M-3)

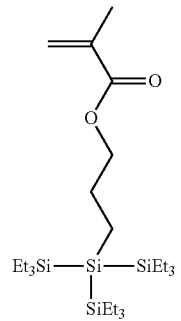
(M-4)

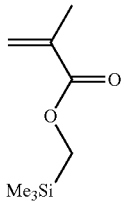
(M-5)

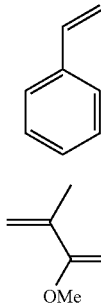
(M-6)

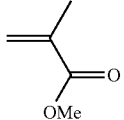
(M-7)

Synthesis Example 1

Synthesis of Polymer (A-1)

After a 500 mL flask as a reaction vessel was dried under reduced pressure, 158 g of tetrahydrofuran, which had been subjected to a dehydrating treatment by distillation, was charged into the flask under a nitrogen atmosphere, and cooled to −78° C. Thereafter, 1.28 mL (1.24 mmol) of a 1 N sec-butyllithium (sec-BuLi) solution in cyclohexane was charged, and a mixture of 8.39 g (80.56 mmol, 60 mol %) of styrene (the monomer (M-6)), which had been subjected to a dehydrating treatment by distillation, and 10 g of tetrahydrofuran, which had been subjected to a distillation treatment, was added dropwise over 30 min. In this dropwise addition, the internal temperature of the reaction solution was carefully adjusted so as not to be −65° C. or higher. After the completion of the dropwise addition, the mixture was aged for 30 min. Then, 4.95 mL (2.48 mmol) of a 0.5 mol/L lithium chloride solution in tetrahydrofuran and 0.53 mL (3.72 mmol) of diphenylethylene were added thereto, and the mixture was sufficiently stirred. Subsequently, 22.60 g (53.45 mmol, 40 mol %) of 3-[tris(trimethylsilyloxy)silyl]propyl methacrylate (the monomer (M-1)), which had been subjected to a dehydrating treatment by distillation, was added dropwise over 30 min. The mixture was aged for 120 min, and then 0.032 g (1.00 mmol) of methanol was added to allow the polymerization end to be deactivated. The resulting resin solution was subjected to purification by precipitation in methanol, and the solvent was removed by filtration to obtain a white solid.

The obtained white solid was dissolved in methyl isobutyl ketone to prepare a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove the Li salt. Then, 500 g of ultra pure water was charged, the mixture was stirred, and then the underlayer, i.e., an aqueous layer, was discarded. This operation was repeated three times to remove oxalic acid. Thereafter, the solution was concentrated, and then the mixture was added dropwise to 2,000 g of methanol to permit deposition of a polymer. The polymer obtained after vacuum filtration was washed twice with methanol, and then dried at 60° C. under reduced pressure to obtain a white polymer (A-1). The polymer (A-1) had an Mw of 20,800, an Mn of 18,300, and an Mw/Mn of 1.13. In addition, the result of $^1$H-NMR analysis indicated that the proportions of the repeating unit derived from (M-1) and the repeating unit derived from (M-6) were 38 mol % and 62 mol %, respectively.

Synthesis Examples 2 to 5

Polymers (A-2) to (A-4) and (A-6) were synthesized in a similar manner to Synthesis Example 1 except that the type and the amount of a monomer employed were as shown in Table 1 below. The Mw, Mn and Mw/Mn of the obtained polymers and the proportions of each repeating unit are shown together in Table 1.

Synthesis Example 6

Synthesis of Polymer (A-8)

After a 500 mL flask as a reaction vessel was dried under reduced pressure, 168 g of tetrahydrofuran, which had been subjected to a dehydrating treatment by distillation, was charged into the flask under a nitrogen atmosphere, and cooled to −78° C. Thereafter, 6.00 mL (2.98 mmol) of a 0.5 mol/L lithium chloride solution in tetrahydrofuran and 0.63 mL (4.48 mmol) of diphenylethylene were added thereto, and the mixture was sufficiently stirred. Subsequently, 1.53 mL (1.50 mmol) of a 1 N sec-butyllithium (sec-BuLi) solution in cyclohexane was charged, and a mixture of 14.8 mL (134.4 mmol, 80 mol %) of methyl methacrylate (the monomer (M-7)), which had been subjected to a dehydrating treatment by distillation, and 10 g of tetrahydrofuran, which had been subjected to a distillation treatment, was added dropwise over 30 min. In this dropwise addition, the internal temperature of the reaction solution was carefully adjusted so as not to be −65° C. or higher. After the completion of the dropwise addition, the mixture was aged for 120 min. Then, a mixture of 15.1 mL (33.1 mmol, 20 mol %) of 3-[tris (trimethylsilyloxy)silyl]propyl methacrylate (the monomer (M-1)) and 10 g of tetrahydrofuran, which had been subjected to a dehydrating treatment by distillation, was added dropwise over 30 min. The mixture was aged for 120 min, and then 0.032 g (1.00 mmol) of methanol was added to allow the polymerization end to be deactivated. The resulting resin solution was subjected to purification by precipitation in methanol, and a white solid was obtained after filtration.

The obtained white solid was dissolved in methyl isobutyl ketone to prepare a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove the Li salt. Then, 500 g of ultra pure water was charged, the mixture was stirred, and then the underlayer, i.e., an aqueous layer, was discarded. This operation was repeated three times to remove oxalic acid. Thereafter, the solution was concentrated, and then the mixture was added dropwise to 2,000 g of methanol to permit deposition of a polymer. The polymer obtained after vacuum filtration was washed twice with methanol, and then dried at 60° C. under reduced pressure to obtain a white polymer (A-8). The polymer (A-8) had an Mw of 18,000, an Mn of 17,600, and an Mw/Mn of 1.02. In addition, the result of $^1$H-NMR analysis indicated that the proportions of the repeating unit derived from (M-1) and the repeating unit derived from (M-7) were 20 mol % and 80 mol %, respectively.

Synthesis Example 7

Synthesis of Polymer (A-9)

After a 500 mL flask as a reaction vessel was dried under reduced pressure, 168 g of tetrahydrofuran, which had been subjected to a dehydrating treatment by distillation, was charged into the flask under a nitrogen atmosphere, and cooled to −78° C. Thereafter, 5.00 mL (2.47 mmol) of a 0.5 mol/L lithium chloride solution in tetrahydrofuran and 0.52 mL (3.71 mmol) of diphenylethylene were added thereto, and the mixture was sufficiently stirred. Thereafter, 1.27 mL (1.24 mmol) of a 1 N sec-butyllithium (sec-BuLi) solution in cyclohexane was charged, a mixture of 8.6 mL (80.4 mmol, 60 mol %) of methyl methacrylate (the monomer (M-7)), which had been subjected to a dehydrating treatment by distillation, and 10 g of tetrahydrofuran, which had been subjected to a distillation treatment, was added dropwise over 30 min. In this dropwise addition, the internal temperature of the reaction solution was carefully adjusted so as not to be −65° C. or higher. After the completion of the dropwise addition, the mixture was aged for 120 min. Then, a mixture of 23.9 mL (53.5 mmol, 40 mol %) of 3-[tris (trimethylsilyloxy)silyl]propyl methacrylate (the monomer (M-1)) and 10 g of tetrahydrofuran, which had been subjected to a dehydrating treatment by distillation, was added dropwise over 30 min. The mixture was aged for 120 min, and then 0.032 g (1.00 mmol) of methanol was added to allow the polymerization end to be deactivated. The resulting resin solution was subjected to purification by precipitation in methanol, and a white solid was obtained after filtration.

The obtained white solid was dissolved in methyl isobutyl ketone to prepare a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove the Li salt. Then, 500 g of ultra pure water was charged, the mixture was stirred, and then the underlayer, i.e., an aqueous layer, was discarded. This operation was repeated three times to remove oxalic acid. Thereafter, the solution was concentrated, and then the mixture was added dropwise to 2,000 g of methanol to permit deposition of a polymer. The polymer obtained after vacuum filtration was washed twice with methanol, and then dried at 60° C. under reduced pressure to obtain a white polymer (A-9). The polymer (A-9) had an Mw of 18,400, an Mn of 17,800, and an Mw/Mn of 1.03. In addition, the result of $^1$H-NMR analysis indicated that the proportions of the repeating unit derived from (M-1) and the repeating unit derived from (M-7) were 40 mol % and 60 mol %, respectively.

Synthesis Example 8

Synthesis of Polymer (A-10)

After a 500 mL flask as a reaction vessel was dried under reduced pressure, 168 g of tetrahydrofuran, which had been subjected to a dehydrating treatment by distillation, was charged into the flask under a nitrogen atmosphere, and cooled to −78° C. Thereafter, 7.00 mL (3.49 mmol) of a 0.5 mol/L lithium chloride solution in tetrahydrofuran and 0.74 mL (5.23 mmol) of diphenylethylene were added thereto, and the mixture was sufficiently stirred. Subsequently, 1.80 mL (1.75 mmol) of a 1 N sec-butyllithium (sec-BuLi) solution in cyclohexane was charged, and a mixture of 21.2 mL (192 mmol, 90 mol %) of methyl methacrylate (the monomer (M-7)), which had been subjected to a dehydrating treatment by distillation, and 10 g of tetrahydrofuran, which had been subjected to a distillation treatment, was added dropwise over 30 min. In this dropwise addition, the internal temperature of the reaction solution was carefully adjusted so as not to be −65° C. or higher. After the completion of the dropwise addition, the mixture was aged for 120 min. Then, a mixture of 9.7 mL (21.3 mmol, 10 mol %) of 3-[tris(trimethylsilyloxy)silyl]propyl methacrylate (the monomer (M-1)) and 10 g of tetrahydrofuran, which had been subjected to a dehydrating treatment by distillation, was added dropwise over 30 min, and the mixture was aged for 120 min. Subsequently, 0.032 g (1.00 mmol) of methanol was added to allow the polymerization end to be deactivated. The resulting resin solution was subjected to purification by precipitation in methanol, and a white solid was obtained after filtration.

The obtained white solid was dissolved in methyl isobutyl ketone to prepare a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove the Li salt. Then, 500 g of ultra pure water was charged, the mixture was stirred, and then the underlayer, i.e., an aqueous layer, was discarded. This operation was repeated three times to remove oxalic acid. Thereafter, the solution was concentrated, and then the mixture was added dropwise to 2,000 g of methanol to permit deposition of a polymer. The polymer obtained after vacuum filtration was washed twice with methanol, and then dried at 60° C. under reduced pressure to obtain a white polymer (A-10). The polymer (A-10) had an Mw of 17,400, an Mn of 17,000, and an Mw/Mn of 1.02. In addition, the result of $^1$H-NMR analysis indicated that the proportions of the repeating unit derived from (M-1) and the repeating unit derived from (M-7) were 10 mol % and 90 mol %, respectively.

Synthesis Example 9

Synthesis of Polymer (A-11)

After a 500 mL flask as a reaction vessel was dried under reduced pressure, 168 g of tetrahydrofuran, which had been subjected to a dehydrating treatment by distillation, was charged into the flask under a nitrogen atmosphere, and cooled to −78° C. Thereafter, 0.83 mL (0.75 mmol) of a 1 N sec-butyllithium (sec-BuLi) solution in cyclohexane was charged, and a mixture of 19.7 mL (171 mmol, 70 mol %) of styrene (the monomer (M-6)), which had been subjected to a dehydrating treatment by distillation, and 10 g of tetrahydrofuran, which had been subjected to a distillation treatment, was added dropwise over 30 min. In this dropwise addition, the internal temperature of the reaction solution was carefully adjusted so as not to be −65° C. or higher. After the completion of the dropwise addition, the mixture was aged for 120 min. Then, 2.98 mL (1.49 mmol) of a 0.5 N lithium chloride solution in tetrahydrofuran and 0.32 mL (2.24 mmol) of diphenylethylene were added thereto, and the mixture was sufficiently stirred. Subsequently, a mixture of 7.7 mL (72.9 mmol, 30 mol %) of methyl methacrylate (the monomer (M-7)) and 10 g of tetrahydrofuran, which had been subjected to a dehydrating treatment by distillation, was added dropwise over 30 min. The mixture was aged for 120 min, and then 0.032 g (1.00 mmol) of methanol was added to allow the polymerization end to be deactivated. The resulting resin solution was subjected to purification by precipitation in methanol, and a white solid was obtained after filtration.

The obtained white solid was dissolved in methyl isobutyl ketone to prepare a 10% by mass solution. To this solution was added 500 g of a 1% by mass aqueous oxalic acid solution with stirring, and after the mixture was left to stand, the underlayer, i.e., an aqueous layer, was discarded. This operation was repeated three times to remove the Li salt. Then, 500 g of ultra pure water was charged, the mixture was stirred, and then the underlayer, i.e., an aqueous layer, was discarded. This operation was repeated three times to remove oxalic acid. Thereafter, the solution was concentrated, and then the mixture was added dropwise to 2,000 g of methanol to permit deposition of a polymer. The polymer obtained after vacuum filtration was washed twice with methanol, and then dried at 60° C. under reduced pressure to obtain a white polymer (A-11). The polymer (A-11) had an Mw of 54,400, an Mn of 50,900, and an Mw/Mn of 1.07. In addition, the result of $^1$H-NMR analysis indicated that the proportions of the repeating unit derived from (M-6) and the repeating unit derived from (M-7) were 70 mol % and 30 mol %, respectively.

TABLE 1

| | | Repeating unit (I) | | Repeating unit (II) | | | | |
|---|---|---|---|---|---|---|---|---|
| | (A) Polymer | monomer type | amount (mol %) | proportion of repeating unit (mol %) | monomer type | amount (mol %) | proportion of repeating unit (mol %) | Mw | Mn | Mw/Mn |
| Synthesis Example 1 | A-1 | M-1 | 40 | 38 | M-6 | 60 | 62 | 20,800 | 18,300 | 1.13 |
| Synthesis Example 2 | A-2 | M-2 | 40 | 39 | M-6 | 60 | 61 | 21,000 | 18,500 | 1.14 |
| Synthesis Example 3 | A-3 | M-3 | 40 | 39 | M-6 | 60 | 61 | 21,200 | 19,000 | 1.12 |
| Synthesis Example 4 | A-4 | M-4 | 40 | 38 | M-6 | 60 | 62 | 20,500 | 18,400 | 1.11 |
| Synthesis Example 5 | A-6 | M-5 | 30 | 29 | M-6 | 70 | 71 | 21,000 | 18,700 | 1.12 |
| Synthesis Example 6 | A-8 | M-1 | 20 | 20 | M-7 | 80 | 80 | 18,000 | 17,600 | 1.02 |
| Synthesis Example 7 | A-9 | M-1 | 40 | 40 | M-7 | 60 | 60 | 18,400 | 17,400 | 1.03 |
| Synthesis Example 8 | A-10 | M-1 | 10 | 10 | M-7 | 90 | 90 | 17,400 | 17,000 | 1.02 |
| Synthesis Example 9 | A-11 | — | — | — | M-6 | 70 | 70 | 54,400 | 50,900 | 1.07 |
| | | | | | M-7 | 30 | 30 | | | |

Synthesis of Polymer for Underlayer Film

Synthesis Example 5

Synthesis of Polysiloxane-Grafted Polymer (N-1)

Under a nitrogen atmosphere, 32.6 g (0.166 mol) of 3-mercaptopropyltrimethoxysilane and 31.9 g (0.234 mol) of methyltrimethoxysilane were charged into a three-neck flask, then 100 g of methyl isobutyl ketone was added to achieve dissolution, and the obtained solution was warmed to 60° C. with stirring by a magnetic stirrer. To this solution was added continuously 8.6 g of an aqueous solution containing 1% by mass of oxalic acid over 1 hour, and the reaction was allowed to proceed at 60° C. for 4 hrs. Thereafter, water, methanol and methyl isobutyl ketone were distilled off under reduced pressure. The obtained product was dissolved in toluene, washed three times with water in a separatory funnel, and dehydrated over a drying agent. Subsequently, toluene was distilled off under reduced pressure, and then the residue was diluted with propylene glycol monomethyl ether acetate to give a 10% by mass solution of a polymer (N-1). The polymer (N-1) had an Mw of 2,615, an Mn of 1,214, and an Mw/Mn ratio of 2.15, as determined by GPC. Infrared spectroscopy of the obtained polymer (N-1) was executed, and an absorption band ascribed to the silanol group was found at 3,750 cm$^{-1}$.

Next, to a flask equipped with a condenser and a stirrer was charged 100 g of methyl ethyl ketone, and nitrogen substitution was carried out. After heating to 85° C., a mixture of 100 g of methyl ethyl ketone, 51 g (0.49 mol) of styrene, 49 g (0.49 mol) of methyl methacrylate and 30 g of the obtained polymer (N-1) solution, and a mixture of 3 g of 2,2-azobisbutyronitrile and methyl ethyl ketone were each added dropwise over 3 hrs, and this temperature was kept for 3 hrs to permit the polymerization. The obtained polymer solution was subjected to purification by precipitation using 3 L of methanol, whereby residual monomers, the initiator and the like were removed to yield a polymer (N-2). The polymer (N-2) had an Mw of 8,280, an Mn of 4,465, and an Mw/Mn ratio of 1.84. The polymer (N-2) was diluted with propylene glycol monomethyl ether acetate to give a 10% by mass polymer solution.

Preparation of Composition for Forming Underlayer Film

A solution containing 150 g of the polymer (N-2) and 9,850 g of PGMEA as a solvent were mixed to give a mixed solution. The mixed solution thus obtained was filtered through a membrane filter having a pore size of 0.1 μm to prepare a composition for forming an underlayer film (U-1).

Preparation of Compositions for Pattern Formation

Components used in the preparation of compositions for pattern formation are shown below.

(A) Block Copolymer

A-1 to A-4, A-6, A-8 to A-11: the polymers (A-1) to (A-4), (A-6), (A-8) to (A-11) synthesized above;

A-5: "P8245-SDMS" available from Polymer Source, a diblock copolymer shown by (A-5) below, which includes a block constituted with a repeating unit represented by the formula (a) and a block constituted with a repeating unit represented by the formula (b), having an Mw of 56,600, an Mn of 48,000, and an Mw/Mn ratio of 1.18 as a result of the determination of the molecular weight, and exhibiting the proportions of the repeating unit represented by the formula (a) and the repeating unit represented by formula (b) of 65 mol % and 35 mol %, respectively as a result of the $^1$H-NMR analysis; and A-7: "P9029-SLA" available from Polymer Source, a diblock copolymer shown by (A-7) below, which includes a block constituted with a repeating unit represented by the formula (c) and a block constituted with a repeating unit represented by the formula (d), having an Mw of 99,000, an Mn of 90,000 and an Mw/Mn ratio of 1.10 as a result of the determination of the molecular weight, and exhibiting the proportions of the repeating unit represented by the formula (c) and the repeating unit represented by the formula (d) of 70 mol % and 30 mol %, respectively, as a result of the $^1$H-NMR analysis.

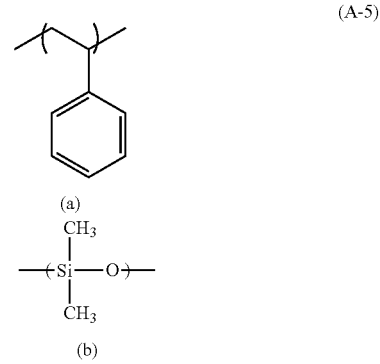

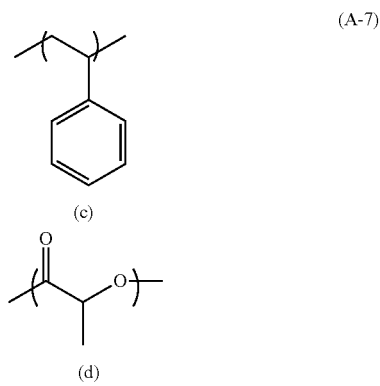

Example 1

(A-1) as the block copolymer (A) was dissolved in propylene glycol monomethyl ether acetate to give a 1% by mass solution. This solution was filtered through a membrane filter having a pore size of 200 nm to prepare a composition for pattern formation (S-1).

Examples 2 to 7 and Comparative Examples 1 to 4

Compositions for pattern formation (S-2) to (S-7) and (CS-1) to (CS-4) were prepared in a similar manner to Example 1 except that the type of the component (A) were as shown in Table 2 below.

Formation of Pattern

Examples 8 to 14 and Comparative Examples 5 to 8

Formation of Underlayer Film

The composition for forming an underlayer film (U-1) prepared above was coated on the surface of a 12-inch silicon wafer to provide a coating film having a film thickness of 5 nm. Next, the coating film was subjected to baking at 220° C. for 120 sec to provide an underlayer film (see FIG. 1).

Formation of Pattern

Examples 8 to 11 and 14, and Comparative Examples 5 to 7

Compositions for Pattern Formation (S-1) to (S-4) and (S-7), and (CS-1) to (CS-3)

Each of the compositions for pattern formation prepared above was coated on the underlayer film provided above such that a coating film had a thickness of 25 nm (see FIG. 6), and then the coating film was heated at 230° C. for 60 sec under a nitrogen atmosphere to achieve phase separation, whereby a directed self-assembling film was formed in which cylindrical microdomains formed by the block (a) were arranged substantially parallel to the substrate (see FIG. 7). Next, this directed self-assembling film was dry etched in two steps to form a line-and-space pattern (see FIG. 8) in Examples 8 to 11 and Comparative Examples 5 to 7, or a hole pattern in Example 14.

Conditions step 1: pressure of 0.03 Torr; high frequency electric power of 300 W; etching gas of $CF_4$; flow rate of 100 sccm; and substrate temperature of 20° C.

step 2: pressure of 0.03 Torr; high frequency electric power of 300 W; etching gas of $O_2$; flow rate of 100 sccm; and substrate temperature of 20° C.

Example 12

Composition for Pattern Formation (S-5)

Figure 9:
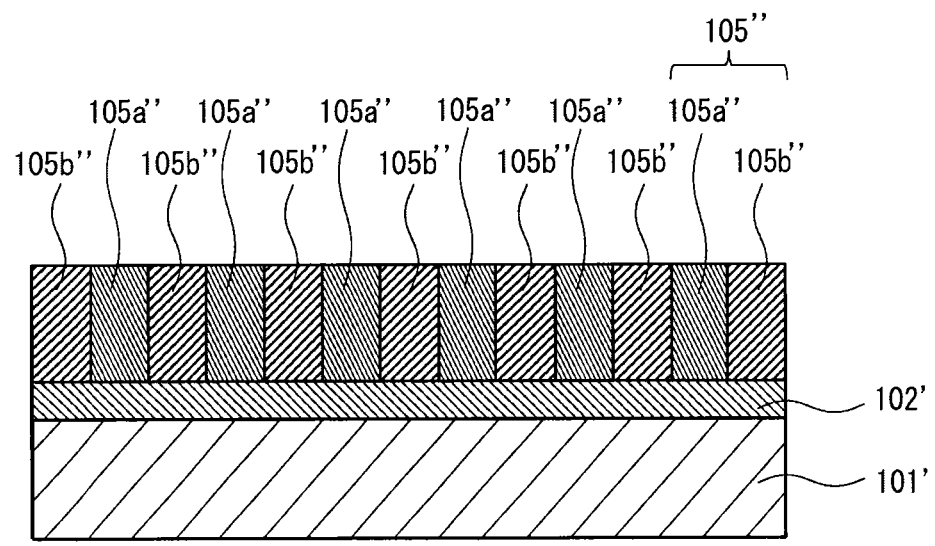
FIG. 9 shows a schematic cross sectional view illustrating one example of a state after converting the coating film shown in FIG. 6 to a directed self-assembling film.
Figure 10:
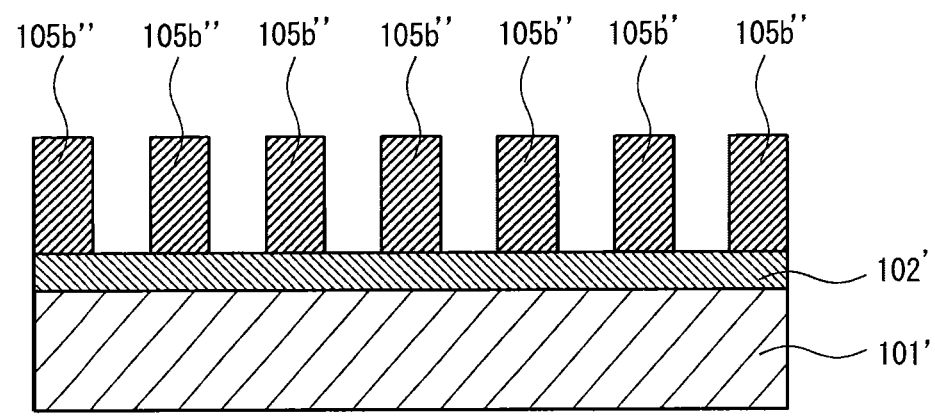
FIG. 10 shows a schematic cross sectional view illustrating one example of a state after removing a part of a plurality of phases of the directed self-assembling film shown in FIG. 9.

In a similar method to Example 8 described above, the composition for pattern formation was coated on an underlayer film 102', and then the coating film was heated to achieve phase separation, whereby a directed self-assembling film (FIG. 9) was formed that had a lamellar structure in which each phase 105a'' and 105b'' was arranged substantially perpendicular to the substrate 101'. Next, this directed self-assembling film was dry etched in two steps similar to Example 8 described above to form a line-and-space pattern (FIG. 10).

Example 13 and Comparative Example 8

Compositions for Pattern Formation (S-6) and (CS-4)

In a similar method to Example 8 described above, each of the compositions for pattern formation was coated on an underlayer film 102', and then the coating film was heated to achieve phase separation, whereby a directed self-assembling film was formed in which cylindrical microdomains of the phase 105b' formed by the block (b) in the phase 105a' were arranged substantially perpendicular to the substrate 101'(see FIG. 11). Next, this directed self-assembling film was dry etched in two steps to form a hole pattern (see FIG. 12).

Evaluations

The compositions for pattern formation prepared above were evaluated on a time period for phase separation, a coating property and pattern formability. The results of the evaluations are shown together in Tables 2 and 3.

Time Period for Phase Separation

The minimum heating time period required for the formation of the pattern in "Formation of Pattern" described above was designated as time period for phase separation (sec).

Coating Property

The compositions for pattern formation were each coated on a silicon substrate by means of a coating apparatus ("CLEAN TRACK ACT12" available from Tokyo Electron Limited), and heated to provide a coating film on a silicon substrate. The film thickness of the coating film was measured at 9 points of the film face by means of a film thickness measuring apparatus ("vacuum ultraviolet spectroscopic ellipsometer VUV-VASE" available from J. A. Woollam Co., Inc.). The coating property was evaluated to be "A" as being superior in uniformity of an in-plane film thickness in the case of the difference between the maximum and the minimum of the measured film thickness being less than 0.5 nm, to be "B" as being moderately uniform in an in-plane film thickness in the case of the aforementioned difference being no less than 0.5 nm and less than 1 nm, and to be "C" as being not uniform in an in-plane film thickness in the case of the aforementioned difference being no less than 1 nm.

Pattern Formability

The patterns formed above were observed using a line-width measurement SEM ("S-4800" available from Hitachi, Ltd.), and the pattern formability was evaluated to be "A" in the case of the pattern being clearly found, to be "B" in the case of the pattern being found, and to be "C" in the case of recesses generated by the etching not having a constant depth.

Pattern Height after Pattern Formation

The pattern height after pattern formation was measured using the line-width measurement SEM. The measured pattern height (nm) is shown in Tables 2 and 3 together. The symbol "-" in Table 2 denotes that the measurement was not made because of the impossibility of the coating or a failure to form a pattern.

Hole Size In the cases where a hole pattern was formed, the hole size thereof was measured using the line-width measurement SEM. The measured hole size (nm) is shown in Table 3 together. The symbol "-" in Table 3 denotes the case where the hole pattern was not formed.

TABLE 2

| Composition | Pattern formation | Composition for pattern formation | (A) Polymer | Time period for phase separation (sec) | Coating property | Pattern formability | Pattern height after pattern formation (nm) |
|---|---|---|---|---|---|---|---|
| Example 1 | Example 8 | S-1 | A-1 | 60 | B | B | 15 |
| Example 2 | Example 9 | S-2 | A-2 | 60 | B | B | 14 |
| Example 3 | Example 10 | S-3 | A-3 | 60 | B | B | 13 |
| Example 4 | Example 11 | S-4 | A-4 | 60 | B | B | 15 |
| Comparative Example 1 | Comparative Example 5 | CS-1 | A-5 | 120 | C | — | — |

TABLE 2-continued

| Composition | Pattern formation | Composition for pattern formation | (A) Polymer | Time period for phase separation (sec) | Coating property | Pattern formability | Pattern height after pattern formation (nm) |
|---|---|---|---|---|---|---|---|
| Comparative Example 2 | Comparative Example 6 | CS-2 | A-6 | 120 | B | B | 6 |
| Comparative Example 3 | Comparative Example 7 | CS-3 | A-7 | 60 | B | C | — |

TABLE 3

| Composition | Pattern formation | Composition for pattern formation | (A) Polymer | Time period for phase separation (sec) | Coating property | Pattern formability | Pattern height after pattern formation (nm) | Hole size (nm) |
|---|---|---|---|---|---|---|---|---|
| Example 5 | Example 12 | S-5 | A-8 | 60 | A | A | 15 | — |
| Example 6 | Example 13 | S-6 | A-9 | 60 | A | A | 15 | 20 |
| Example 7 | Example 14 | S-7 | A-10 | 60 | A | A | 15 | 20 |
| Comparative Example 4 | Comparative Example 8 | CS-4 | A-11 | 120 | B | B | 14 | 30 |

As shown in Tables 2 and 3, it was found that when the compositions for pattern formation according to Examples were used, a sufficiently fine microdomain structure was achieved, and a pattern having a favorable pattern height was obtained. In addition, a time period for phase separation was shorter, and the coating property was favorable. On the other hand, in the case of the compositions for pattern formation according to Comparative Examples, a composition that was difficult to achieve phase separation in the pattern formation and therefore required a long time period for phase separation, a composition that failed to form a microdomain structure, a composition that exhibited an inferior coating property, and the like were found.

The composition for pattern formation and the pattern-forming method according to the embodiments of the present invention enable a sufficiently fine pattern to be formed while an appropriately short time period for phase separation and a proper coating property are ensured. Therefore, these can be suitably used for lithography processes in manufacture of various types of electronic devices such as semiconductor devices and liquid crystal devices for which further microfabrication is demanded.

Obviously, numerous modifications and variations of the present invention are possible in light of the above teachings. It is therefore to be understood that within the scope of the appended claims, the invention may be practiced otherwise than as specifically described herein.

The invention claimed is:
1. A pattern-forming method comprising:
applying a composition directly or indirectly on a substrate such that a directed self-assembling film having a phase separation structure is provided directly or indirectly on the substrate, the phase separation structure comprising a plurality of phases; and
removing a part of the plurality of phases of the directed self-assembling film,
wherein the composition comprises:
a block copolymer capable of forming a phase separation structure through directed self-assembly, the block copolymer comprising:
a first block comprising a first repeating unit which comprises at least two silicon atoms; and
a second block comprising a second repeating unit which does not comprise a silicon atom; and
a solvent,
wherein a sum of the atomic weight of atoms constituting the first repeating unit is no greater than 700,
wherein the first repeating unit is a repeating unit represented by formula (1), a repeating unit represented by formula (2-1), a repeating unit represented by formula (2-2), a repeating unit represented by formula (2-3), a repeating unit represented by formula (2-4), a repeating unit represented by formula (2-5), a repeating unit represented by formula (2-6), a repeating unit represented by formula (2-7), a repeating unit represented by formula (2-8), or a combination thereof:

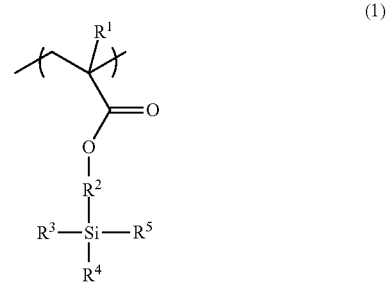

(1)

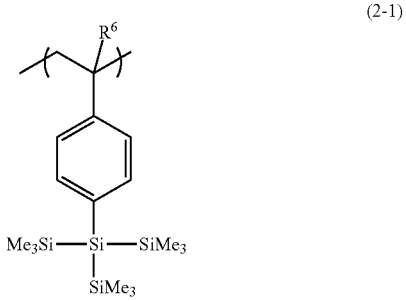

(2-1)

-continued (2-2) 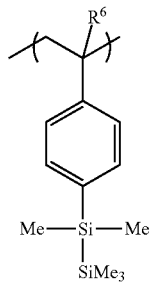

(2-3) 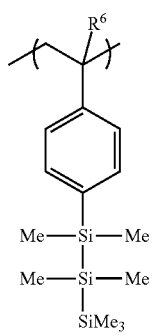

(2-4) 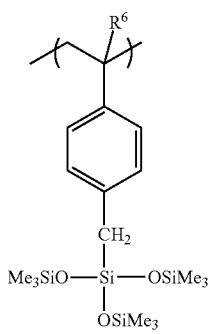

(2-5) 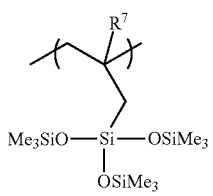

(2-6) 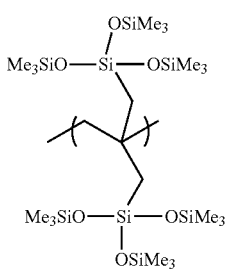

(2-7) 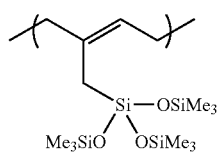

-continued (2-8) 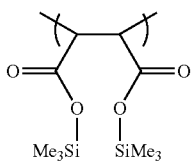

wherein:
$R^1$ represents a hydrogen atom or a methyl group;
$R^2$ represents a divalent hydrocarbon group having 1 to 10 carbon atoms;
$R^3$, $R^4$ and $R^5$ each independently represent a hydrogen atom, a monovalent hydrocarbon group having 1 to 10 carbon atoms, —SiR'$_3$, —Si$_2$R'$_5$ or —OSiR'$_3$, or
two of $R^3$, $R^4$ and $R^5$ taken together represent a ring structure having 3 to 10 ring atoms together with the silicon atom to which the two of $R^3$, $R^4$ and $R^5$ bond, and the rest of $R^3$, $R^4$ and $R^5$ represents a hydrogen atom, a monovalent hydrocarbon group having 1 to 10 carbon atoms, —SiR'$_3$, —Si$_2$R'$_5$ or —OSiR'$_3$;
each R' independently represents a hydrogen atom or a monovalent hydrocarbon group having 1 to 10 carbon atoms, wherein at least one of $R^3$, $R^4$ and $R^5$ represents —SiR'$_3$, —Si$_2$R'$_5$ or —OSiR'$_3$, and wherein a sum of the number of carbon atoms included in $R^3$, $R^4$ and $R^5$ is no greater than 20;
each $R^6$ independently represents a hydrogen atom or a methyl group;
$R^7$ represents a hydrogen atom or a methyl group; and
Me represents a methyl group, and
wherein a line-and-space pattern is formed, and a molar ratio of the first repeating unit to the second repeating unit is from 35/65 to 65/35.

2. The pattern-forming method according to claim 1, further comprising:
providing an underlayer film directly or indirectly on the substrate before applying the composition on the substrate.

3. The pattern-forming method according to claim 1, further comprising:
forming a prepattern directly or indirectly on the substrate before applying the composition on the substrate.

4. The pattern-forming method according to claim 1, wherein the second block is a polystyrene block comprising an unsubstituted or substituted styrene unit, or a poly(meth)acrylic acid ester block comprising a (meth)acrylic acid ester unit.

5. The pattern-forming method according to claim 1, wherein the block copolymer is a diblock copolymer or a triblock copolymer.

6. The pattern-forming method according to claim 1, wherein the lower limit of the number of the silicon atoms included in the first repeating unit is 3.

7. The pattern-forming method according to claim 1, wherein the lower limit of the number of the silicon atoms included in the first repeating unit is 4.

8. The pattern-forming method according to claim 1, wherein the upper limit of the number of the silicon atoms included in the first repeating unit is 15.

9. The pattern-forming method according to claim 1, wherein the upper limit of the number of the silicon atoms included in the first repeating unit is 7.

10. The pattern-forming method according to claim 1, the sum of the atomic weight of atoms constituting the first repeating unit is no greater than 450.

11. A pattern-forming method comprising:
applying a composition directly or indirectly on a substrate such that a directed self-assembling film having a phase separation structure is provided directly or indirectly on the substrate, the phase separation structure comprising a plurality of phases; and
removing a part of the plurality of phases of the directed self-assembling film,
wherein the composition comprises:
  a block copolymer capable of forming a phase separation structure through directed self-assembly, the block copolymer comprising:
    a first block comprising a first repeating unit which comprises at least two silicon atoms; and
    a second block comprising a second repeating unit which does not comprise a silicon atom; and
  a solvent,
wherein a sum of the atomic weight of atoms constituting the first repeating unit is no greater than 700,
wherein the first repeating unit is a repeating unit represented by formula (1), a repeating unit represented by formula (2-1), a repeating unit represented by formula (2-2), a repeating unit represented by formula (2-3), a repeating unit represented by formula (2-4), a repeating unit represented by formula (2-5), a repeating unit represented by formula (2-6), a repeating unit represented by formula (2-7), a repeating unit represented by formula (2-8), or a combination thereof:

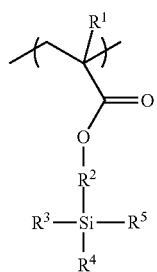
(1)

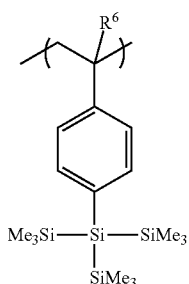
(2-1)

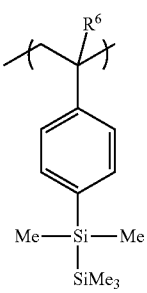
(2-2)

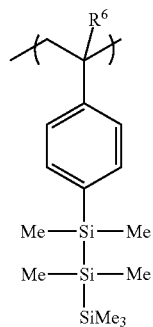
(2-3)

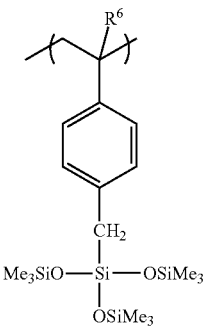
(2-4)

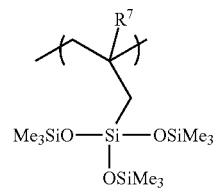
(2-5)

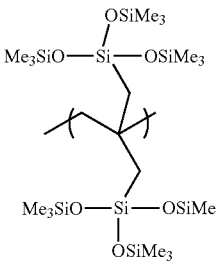
(2-6)

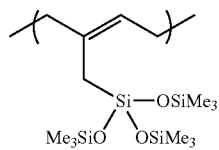
(2-7)

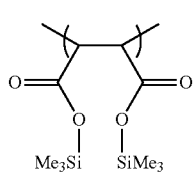
(2-8)

wherein:
  $R^1$ represents a hydrogen atom or a methyl group;
  $R^2$ represents a divalent hydrocarbon group having 1 to 10 carbon atoms;
  $R^3$, $R^4$ and $R^5$ each independently represent a hydrogen atom, a monovalent hydrocarbon group having 1 to 10 carbon atoms, —SiR'$_3$, —Si$_2$R'$_5$ or —OSiR'$_3$, or two of $R^3$, $R^4$ and $R^5$ taken together represent a ring structure having 3 to 10 ring atoms together with the silicon atom to which the two of $R^3$, $R^4$ and $R^5$ bond, and the rest of $R^3$, $R^4$ and $R^5$ represents a hydrogen atom, a monovalent hydrocarbon group having 1 to 10 carbon atoms, —SiR'$_3$, —Si$_2$R'$_5$ or —OSiR'$_3$;

each R' independently represents a hydrogen atom or a monovalent hydrocarbon group having 1 to 10 carbon atoms, wherein at least one of $R^3$, $R^4$ and $R^5$ represents —SiR'$_3$, —Si$_2$R'$_5$ or —OSiR'$_3$, and wherein a sum of the number of carbon atoms included in $R^3$, $R^4$ and $R^5$ is no greater than 20;

each $R^6$ independently represents a hydrogen atom or a methyl group;

$R^7$ represents a hydrogen atom or a methyl group; and

Me represents a methyl group, and wherein a hole pattern is formed, and a molar ratio of the first repeating unit to the second repeating unit is from 20/80 to 80/20.

12. The pattern-forming method according to claim 11, further comprising:
providing an underlayer film directly or indirectly on the substrate before applying the composition on the substrate.

13. The pattern-forming method according to claim 11, further comprising:
forming a prepattern directly or indirectly on the substrate before applying the composition on the substrate.

14. The pattern-forming method according to claim 11, wherein the second block is a polystyrene block comprising an unsubstituted or substituted styrene unit, or a poly(meth) acrylic acid ester block comprising a (meth)acrylic acid ester unit.

15. The pattern-forming method according to claim 11, wherein the block copolymer is a diblock copolymer or a triblock copolymer.

16. The pattern-forming method according to claim 11, wherein the lower limit of the number of the silicon atoms included in the first repeating unit is 3.

17. The pattern-forming method according to claim 11, wherein the lower limit of the number of the silicon atoms included in the first repeating unit is 4.

18. The pattern-forming method according to claim 11, wherein the upper limit of the number of the silicon atoms included in the first repeating unit is 15.

19. The pattern-forming method according to claim 11, wherein the upper limit of the number of the silicon atoms included in the first repeating unit is 7.

20. The pattern-forming method according to claim 11, the sum of the atomic weight of atoms constituting the first repeating unit is no greater than 450.

* * * * *